US006604204B1

(12) United States Patent
Ozdemir et al.

(10) Patent No.: US 6,604,204 B1
(45) Date of Patent: Aug. 5, 2003

(54) CIRCUIT AND METHOD FOR RECOVERING SYNCHRONIZATION INFORMATION FROM A SIGNAL

(75) Inventors: Hakan Ozdemir, San Jose, CA (US); Francesco Rezzi, Santa Clara, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/410,274

(22) Filed: Sep. 30, 1999

(51) Int. Cl.[7] ................................................ H04L 7/00
(52) U.S. Cl. ........................ 713/400; 713/400; 713/500; 713/600; 714/769
(58) Field of Search ................................ 713/400, 500, 713/600; 714/769

(56) References Cited

U.S. PATENT DOCUMENTS

| | | | | |
|---|---|---|---|---|
| 3,699,261 A | * | 10/1972 | Tomozawa | 179/15 BS |
| 5,384,671 A | * | 1/1995 | Fisher | 360/51 |
| 5,430,744 A | | 7/1995 | Fettweis et al. | 371/43 |
| 5,729,396 A | * | 3/1998 | Dudley et al. | 360/51 |
| 5,793,548 A | * | 8/1998 | Zook | 360/51 |
| 5,854,717 A | * | 12/1998 | Minuhin | 360/65 |

* cited by examiner

*Primary Examiner*—Thomas Lee
*Assistant Examiner*—N Patel
(74) *Attorney, Agent, or Firm*—Lisa K. Jorgenson; Bryan A. Santarelli

(57) ABSTRACT

A synchronizer circuit includes an input terminal, an output terminal, and a recovery circuit coupled to the input and output terminals. The input terminal receives an input signal that includes a sync mark, and the recovery circuit is operable to recover the sync mark from the input signal and to generate a synchronization signal on the output terminal in response to the recovered synchronization mark. For example, such a synchronizer circuit can recover the synchronization mark from a read signal and locate the beginning of a data stream for a Viterbi detector that is separate from the circuit. By performing the sync-recovery function in a separate circuit, one can reduce the complexity and increase the data-recovery speed of the Viterbi detector. Furthermore, the synchronizer circuit can recover the sync mark by executing state-transition routines in alignment with the input signal. For example, one can align the synchronizer circuit's state-transition routines to the preamble of the read signal. Such alignment increases the circuit's noise immunity, and thus allows the circuit to recover the sync mark from a read signal having a SNR that is lower than the minimum read-signal SNR of prior sync-recovery circuits. Furthermore, such alignment reduces the time needed for the circuit to reliably detect the sync mark, and thus allows one to shorten the pad of the data forerunner.

31 Claims, 33 Drawing Sheets

| | V0$_{t+1}$ | V1$_{t+1}$ | V0$_{t+2}$ | V1$_{t+2}$ |
|---|---|---|---|---|
| Reg 0 | 0 | 0 | 0 | 0 |
| Reg 1 | 0 | 0 | 0 | 0 |
| Reg 6 | 0 | 0 | 0 | 1 |
| Reg 7 | 0 | 1 | 0 | 0 |

| | Reg 0 | Reg 1 | Reg 6 | Reg 7 |
|---|---|---|---|---|
| $V0_{t+1}$ | 0 | 0 | 0 | 0 |
| $V1_{t+1}$ | 0 | 0 | 1 | 1 |
| $V0_{t+2}$ | 0 | 0 | 0 | 0 |
| $V1_{t+2}$ | 1 | 0 | 0 | 0 |
| $V0_{t+3}$ | 0 | 0 | 0 | 0 |
| $V1_{t+3}$ | 0 | 1 | 0 | 0 |

| | Reg 0 | Reg 1 | Reg 6 | Reg 7 |
|---|---|---|---|---|
| $V0_{t+1}$ | 0 | 0 | 0 | 0 |
| $V1_{t+1}$ | 0 | 0 | 0 | 0 |
| $V0_{t+2}$ | 0 | 0 | 0 | 0 |
| $V1_{t+2}$ | 1 | 1 | 1 | 1 |
| $V0_{t+3}$ | 0 | 0 | 0 | 0 |
| $V1_{t+3}$ | 0 | 0 | 0 | 0 |
| $V0_{t+4}$ | 0 | 0 | 0 | 0 |
| $V1_{t+4}$ | 0 | 0 | 0 | 0 |
| $V0_{t+5}$ | 0 | 0 | 0 | 0 |
| $V1_{t+5}$ | 0 | 0 | 0 | 0 |
| $V0_{t+6}$ | 0 | 0 | 0 | 0 |
| $V1_{t+6}$ | 1 | 1 | 0 | 0 |
| $V0_{t+7}$ | 0 | 0 | 0 | 0 |
| $V1_{t+7}$ | 0 | 0 | 0 | 1 |
| $V0_{t+8}$ | 0 | 0 | 0 | 0 |
| $V1_{t+8}$ | 0 | 0 | 1 | 0 |

*Fig. 17B*

| | V0$_{t+1}$ | V1$_{t+1}$ | V0$_{t+2}$ | V1$_{t+2}$ | V0$_{t+3}$ | V1$_{t+3}$ | V0$_{t+4}$ | V1$_{t+4}$ | V0$_{t+5}$ | V1$_{t+5}$ | V0$_{t+6}$ | V1$_{t+6}$ | V0$_{t+7}$ | V1$_{t+7}$ | V0$_{t+8}$ | V1$_{t+8}$ | V0$_{t+9}$ | V1$_{t+9}$ |
|---|---|---|---|---|---|---|---|---|---|---|---|---|---|---|---|---|---|---|
| Reg 0 | 0 | 0 | 0 | 1 | 0 | 0 | 0 | 0 | 0 | 0 | 0 | 0 | 0 | 0 | 0 | 1 | 0 | 0 |
| Reg 1 | 0 | 0 | 0 | 1 | 0 | 0 | 0 | 0 | 0 | 0 | 0 | 1 | 0 | 0 | 0 | 0 | 0 | 1 |
| Reg 6 | 0 | 0 | 0 | 1 | 0 | 0 | 0 | 0 | 0 | 0 | 0 | 0 | 0 | 0 | 1 | 0 | 0 | 0 |
| Reg 7 | 0 | 0 | 0 | 1 | 0 | 0 | 0 | 0 | 0 | 0 | 0 | 0 | 0 | 1 | 0 | 0 | 0 | 0 |

| | V0$_{t+2}$ | V1$_{t+2}$ | V0$_{t+3}$ | V1$_{t+3}$ | V0$_{t+4}$ | V1$_{t+4}$ | V0$_{t+5}$ | V1$_{t+5}$ | V0$_{t+6}$ | V1$_{t+6}$ | V0$_{t+7}$ | V1$_{t+7}$ | V0$_{t+8}$ | V1$_{t+8}$ | V0$_{t+9}$ | V1$_{t+9}$ | V0$_{t+10}$ | V1$_{t+10}$ | V0$_{t+11}$ | V1$_{t+11}$ |
|---|---|---|---|---|---|---|---|---|---|---|---|---|---|---|---|---|---|---|---|---|
| Reg 0 | 0 | 1 | 0 | 0 | 0 | 0 | 0 | 0 | 0 | 0 | 1 | 0 | 0 | 0 | 0 | 0 | 0 | 1 | 0 | 0 |
| Reg 1 | 0 | 1 | 0 | 0 | 0 | 0 | 0 | 0 | 0 | 0 | 1 | 0 | 0 | 0 | 0 | 0 | 0 | 0 | 0 | 1 |
| Reg 6 | 0 | 1 | 0 | 0 | 0 | 0 | 0 | 0 | 0 | 0 | 1 | 0 | 0 | 0 | 0 | 0 | 0 | 0 | 0 | 0 |
| Reg 7 | 0 | 1 | 0 | 0 | 0 | 0 | 0 | 0 | 0 | 0 | 1 | 0 | 0 | 0 | 0 | 0 | 0 | 0 | 0 | 0 |

Fig. 20B

CIRCUIT AND METHOD FOR RECOVERING SYNCHRONIZATION INFORMATION FROM A SIGNAL

CROSS-REFERENCE TO RELATED APPLICATIONS

This application is related to U.S. patent application Ser. No. 09/410,276 entitled now U.S. Pat. No. 6,492,918, CODE AND METHOD FOR ENCODING DATA, and U.S. patent application Ser. No. 09/409,923 entitled PARITY-SENSITIVE VITERBI DETECTOR AND METHOD FOR RECOVERING INFORMATION FROM A READ SIGNAL, which have the same filing date as the present application and which are incorporated by reference.

TECHNICAL FIELD OF THE INVENTION

The invention is related generally to electronic circuits, and more particularly to a circuit and method for recovering synchronization information from a signal. In one embodiment, the circuit signals the beginning of a data stream to a Viterbi detector, and the circuit is separate from the Viterbi detector. In another embodiment, the circuit has a greater noise immunity than prior synchronization circuits, and thus can more accurately recover synchronization information from a read signal having a reduced signal-to-noise ratio (SNR). In yet another embodiment, the circuit can recover the synchronization information in fewer cycles, and thus with fewer pad bits, than prior synchronization circuits.

BACKGROUND OF THE INVENTION

FIG. 1 is a partial block diagram of a conventional disk drive 10, which includes a magnetic storage disk 12 and a read channel 14 for reading data-synchronization information and encoded data from the disk 12. The read channel 14 includes a read head 16 for sensing the data-synchronization information and the encoded data stored on the disk 12 and for generating a corresponding read signal. A clock circuit 18 recovers a clock from the read signal, and a read circuit 20 amplifies the read signal, samples the read signal on the edges of the clock, and digitizes the samples. Using the data-synchronization information to locate the first data bit, the Viterbi detector 22 recovers the encoded data from the digitized samples. A decoder 24, which uses the data-synchronization information to locate the first recovered data bit from the Viterbi detector 22, decodes the recovered data.

FIG. 2 is a timing diagram of the data-synchronization information and the data stored on the disk 12 (FIG. 1) in the order sensed by the read head 16 (FIG. 1). The disk 12 includes a number of concentric tracks (not shown) that each include one or more respective data sectors, each sector including respective data-storage locations. Each data sector to which data has been written stores a data forerunner and the data in its storage locations. The data forerunner includes a synchronization wedge, a preamble, a synchronization mark (hereinafter sync mark), and a pad. Typically, the disk drive 10 (FIG. 1) writes a respective wedge at the beginning of each data sector during the formatting of the disk 12, and writes the preamble, sync mark, and pad to a data sector each time one writes data to the data sector. As the disk 12 rotates, the read head 16 first senses the wedge at time $t_0$, and then senses the preamble, sync mark, pad, and data at relative times $t_1$, $t_2$, $t_3$, and $t_4$, respectively.

Referring to FIGS. 1 and 2, the read channel 14 operates as follows. A front-end circuit (not shown) receives the read signal and activates the clock circuit 18 in response to the synchronization wedge. Once activated, the clock circuit 18, which typically includes a phase-locked loop (PLL, not shown), aligns the phase and frequency of the clock signal with the phase and frequency of the preamble. Next, the Viterbi detector 22 recovers from the sync mark the time— typically the clock edge—at which the detector 22 will receive the first data sample. The pad includes a number of don't-care bits, and thus provides a delay between the end of the sync mark and the beginning of the data. This delay allows the detector 22 to reliably recover this first-data-sample time before it actually occurs. The detector 22 then begins recovering the data from the read signal at the first-data-sample time. After a delay equal to its latency, the detector 22 provides the first recovered data bit to the decoder 24 at a first-recovered-bit time, and synchronizes the decoder 24 such that it begins decoding the recovered data at the first-recovered-bit time. But as discussed below, if the detector 22 fails to accurately recover the first-data-sample time, then it begins recovering the data at the wrong sample time, and thus typically generates fatal read errors.

One problem with the Viterbi detector 22 is that it often requires the read signal to have a relatively high signal-to-noise ratio (SNR), and thus often limits the data-storage density, and thus the data-storage capacity, of the disk 12.

The storage density of the disk 12 is a function of the distances between the storage locations within the data sectors and the distances between the disk tracks. The smaller these distances, the greater the storage density, and vice-versa. The storage capacity of the disk 12 is proportional to its surface area and its storage density. But because the diameter of the disk 12, and thus its surface area, is typically constrained to industry-standard sizes, the option of increasing the surface area of the disk 12 to increase its storage capacity is usually unavailable to disk-drive manufacturers. Therefore, increasing the storage density is typically the only available technique for increasing the storage capacity of the disk 12.

Typically, the greater the storage density of the disk 12, the closer the surrounding storage locations are to the read head 16 while it is reading the surrounded storage location, and thus the lower the signal-to-noise ratio (SNR) of the read signal. Specifically, the closer the surrounding locations are to the read head 16, the greater the magnitudes of the magnetic fields that these locations respectively generate at the head 16, and thus the greater the Inter Symbol Interference (ISI). The greater the ISI, the smaller the root-mean-square (RMS) amplitude of the read signal. In addition, as the storage density of the disk 12 increases, the media noise also increases. Generally, the media noise results from the uncertainty in the shapes of the read pulses that compose the read signal. This uncertainty is caused by unpredictable variations in the relative positions of the storage locations from one data-write cycle to the next. Moreover, for a given spin rate of the disk 12, as one increases the linear storage density within the data sectors, he/she must also increase the bandwidth of the read head 16 to accommodate the increased number of storage locations that the read head 16 must sense in a given time period. This increase in bandwidth causes a proportional increase in the white noise generated by the read head 16. The SNR of the read signal for a particular storage location is the ratio of the RMS amplitude of the corresponding portion of the read signal to the sum of the amplitudes of the corresponding media and white noise. Thus, the lower the RMS amplitude of the read signal and the greater the amplitudes of the media and/or white noise, the lower the SNR of the read signal.

Unfortunately, as the SNR of the read signal decreases, the data-recovery speed of the Viterbi detector 20 often decreases as well. Specifically, the lower the SNR of the read signal, the lower the accuracy of the detector 20. As discussed above, the failure of the detector 20 to accurately recover the first-data-sample time from the sync mark often causes serious read errors. If the error processing circuit (not shown) initially detects a read error, then it tries to correct the error using conventional error-correction techniques. If the processing circuit cannot correct the error using these techniques—typically the case when the detector 20 recovers an inaccurate first-data-sample time—then it identifies the error as "fatal" and instructs the read channel 14 to re-read the data from the disk 12. The time needed by the processing circuit for error detection and error correction and the time needed by the read channel 14 for data re-read increase as the number and severity of the read errors increase. As the error-processing and data re-read times increase, the effective data-read speed of the channel 14, and thus of the disk drive 10, decreases.

Therefore, to maintain an acceptable effective data-read speed, the manufacture rates the Viterbi detector 22 for a minimum read-signal SNR. Unfortunately, if the SNR of the read signal falls below this minimum, then the accuracy of the read channel 14 often degrades such that at best, the effective data-read speed of the disk drive 10 falls below its maximum rated speed, and at worst, the disk drive 10 cannot accurately read the stored data.

Referring again to FIGS. 1 and 2, another problem is that the Viterbi detector 22 recovers both the data-synchronization information and the data. Unfortunately, this dual functionality often increases the circuit complexity and limits the effective data-recovery speed of the detector 22.

Furthermore, including the pad in the data forerunner reduces the amount of data that the respective data sector can hold. But eliminating or reducing the length of the pad may decrease the sync-recovery accuracy of the Viterbi detector 22, and thus may increase the probability of a fatal read error that requires the read channel 14 to reread the data.

Detailed descriptions of the structure and operation of a conventional Viterbi detector such as the Viterbi detector 22 are available in many references and in the background section of heretofore incorporated U.S. patent application Ser. No. 09/409,923.

SUMMARY OF THE INVENTION

In one aspect of the invention, a synchronizer circuit includes an input terminal, an output terminal, and a recovery circuit coupled to the input and output terminals. The input terminal receives an input signal that includes a sync mark, and the recovery circuit is operable to recover the sync mark from the input signal and to generate a synchronization signal on the output terminal in response to the recovered synchronization mark.

For example, such a synchronizer circuit can recover the synchronization mark from a read signal and locate the beginning of a data stream for a Viterbi detector that is separate from the circuit. By performing the sync-recovery function in a separate circuit, one can reduce the complexity and increase the data-recovery speed of the Viterbi detector.

In another aspect of the invention, the synchronizer circuit recovers the sync mark by executing state-transition routines in alignment with the input signal.

For example, one can align the synchronizer circuit's state-transition routines to the preamble of the read signal. Such alignment increases the circuit's noise immunity, and thus allows the circuit to recover the sync mark from a read signal having a SNR that is lower than the minimum read-signal SNR of prior sync-recovery circuits. Furthermore, such alignment reduces the time needed for the circuit to reliably detect the sync mark, and thus allows one to shorten the pad of the data forerunner.

BRIEF DESCRIPTION OF THE DRAWINGS

FIG. 11B shows the contents of the sync-circuit shift registers of FIG. 4 corresponding to the trellis diagram of FIG. 11A.

FIG. 12B shows the contents of the sync-circuit shift registers of FIG. 4 corresponding to the trellis diagram of FIG. 12A.

FIG. 13B shows the contents of the sync-circuit shift registers of FIG. 4 corresponding to the trellis diagram of FIG. 13A.

FIG. 14B shows the contents of the sync-circuit shift registers of FIG. 4 corresponding to the diagram of FIG. 14A.

FIG. 15B shows the contents of the sync-circuit shift registers of FIG. 4 corresponding to the trellis diagram of FIG. 15A.

FIG. 16B shows the contents of the sync-circuit shift registers of FIG. 4 corresponding to the trellis diagram of FIG. 16A.

FIG. 17B shows the contents of the sync-circuit shift registers of FIG. 4 corresponding to the trellis diagram of FIG. 17A.

FIG. 18B shows the contents of the sync-circuit shift registers of FIG. 4 corresponding to the trellis diagram of FIG. 18A.

FIG. 19B shows the contents of the sync-circuit shift registers of FIG. 4 corresponding to the trellis diagram of FIG. 19A.

FIG. 20B shows the contents of the sync-circuit shift registers of FIG. 4 corresponding to the trellis diagram of FIG. 20A.

DESCRIPTION OF THE INVENTION

Figure 3:
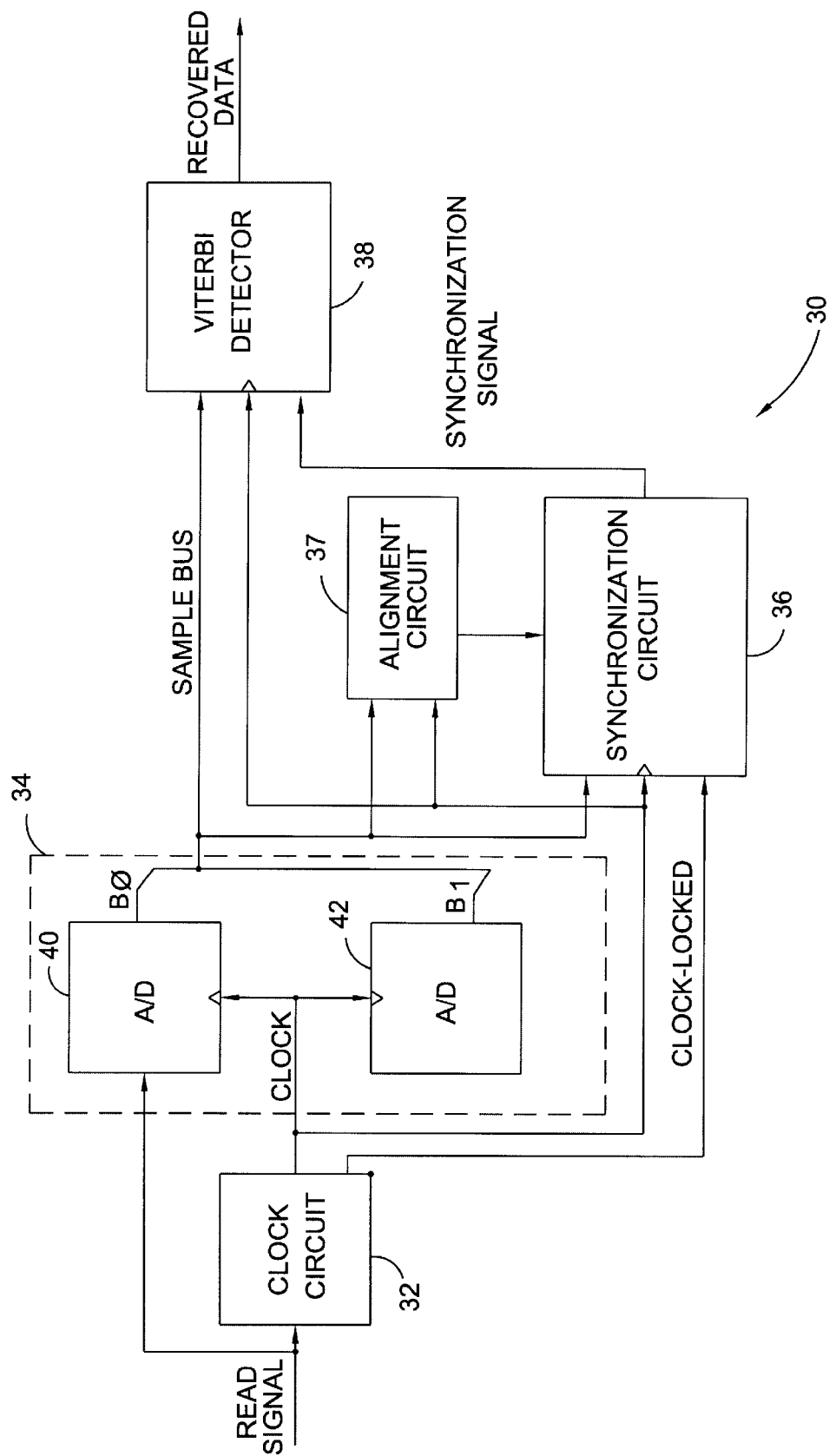
FIG. 3 is a partial block diagram of a read channel according to an embodiment of the invention.

FIG. 3 is a partial block diagram of a read channel 30 according to an embodiment of the invention. The channel 30 includes a clock circuit 32, a read circuit 34, a synchronization circuit 36 for recovering synchronization information from a read signal, an alignment circuit 37 for aligning the circuit 36 to the read signal, and a Viterbi detector 38 for recovering data from the read signal. The channel 30 may also include a decoder 39 for decoding the recovered data. Because the Viterbi detector 38 need not recover the synchronization information, it can have simpler circuitry and recover data faster than prior Viterbi detectors. In one embodiment, the channel 30 is compatible with an EPR4 data-recovery protocol, the Viterbi detector 38 is similar to the Viterbi detector described in heretofore incorporated U.S. patent application Ser. No. 09/409,923, and the decoder 39 is similar to the decoder described in heretofore incorporated U.S. patent application Ser. No. 09/410,276. In another embodiment discussed below, the alignment circuit 37 causes the sync circuit 36 to recover the sync information by executing its state-transition routines in alignment with the read signal. This alignment increases the noise immunity of the circuit 36, and thus allows the circuit 36 to recover the sync information from a read signal having a SNR that is lower than the minimum read-signal SNR specified for prior Viterbi detectors. Furthermore, such alignment reduces the time needed for the circuit to reliably detect the sync information, and thus allows one to reduce the length of the pad within the data forerunner.

Figure 4:
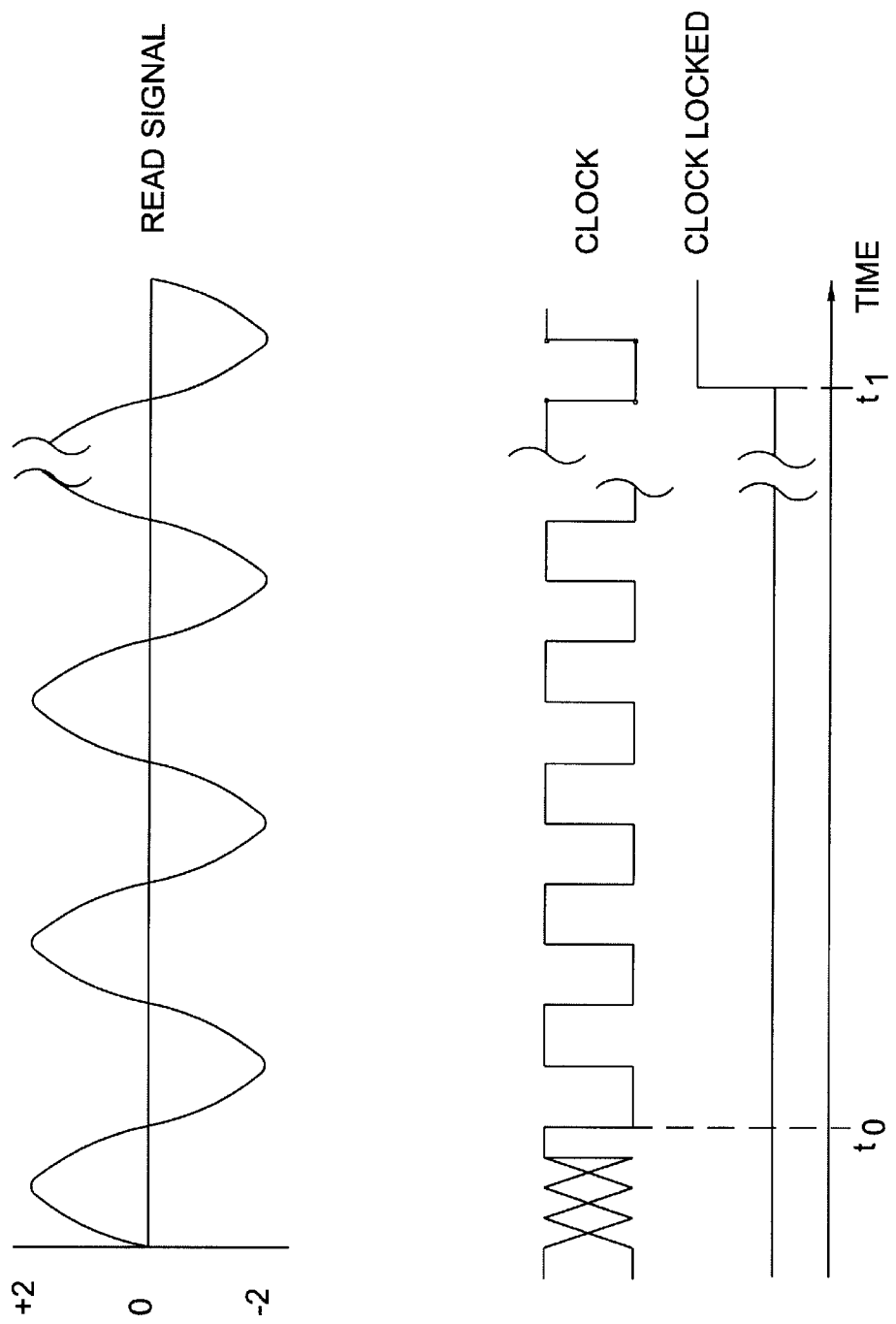
FIG. 4 is a timing diagram of the clock and read signals of FIG. 3 during the reading of the preamble according to an embodiment of the invention.
Figure 5:
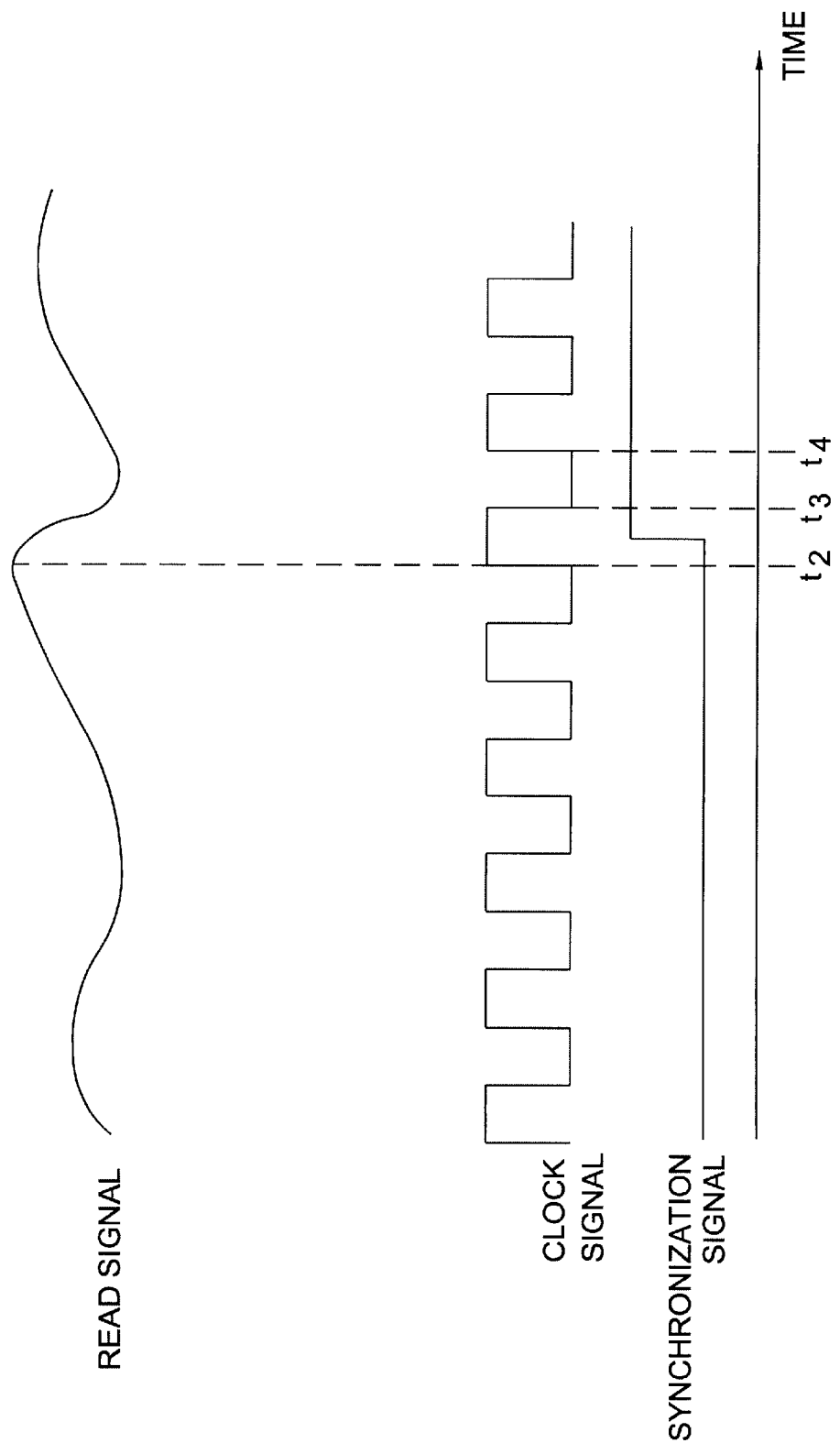
FIG. 5 is a timing diagram of the read, clock, and sync signals of FIG. 3 during the reading of the data according to an embodiment of the invention.

Referring to FIGS. 3–5, the operation of the read channel 30 is described according to an embodiment of the invention.

FIG. 4 is a timing diagram of the read, clock, and clock-locked signals of FIG. 3 as the read head (not shown in FIG. 3) reads the preamble from a data sector (not shown). In one embodiment, the preamble stored in the data sector is 0011001100110011 . . . and is no more than 200 bits long.

Ignoring noise for purposes of illustration, the read signal is a sinusoid as the read head reads the preamble. In terms of the EPR4 samples B—the details of the EPR4 protocol are discussed in heretofore incorporated U.S. patent application Ser. No. 09/409,923—the read signal has a positive peak amplitude of +2 and a negative peak amplitude of −2. Referring to FIGS. 3 and 4, the clock circuit 32 locks the clock signal to the read signal while the read head reads the preamble. A conventional front-end circuit (not shown) enables the clock circuit 32 to begin generating the clock signal in response to the first zero crossing of the read signal at time $t_0$. Specifically, at $t_0$, the clock circuit 32 generates a falling edge of the clock signal, and, over the next few cycles of the read signal, aligns the subsequent falling clock edges with the respective zero crossings of the read signal as shown. Therefore, the clock signal is twice the frequency of the read signal as the read head reads the preamble.

After it has locked the phase and frequency of the clock signal to the read signal, the clock circuit 32 transitions the clock-locked signal from one logic level to the other—from logic 0 to logic 1 in this embodiment—at time $t_1$ to indicate that the clock signal is locked. In one embodiment, the manufacturer empirically determines the lock time, and programs the clock circuit 32 to transition the clock-locked signal after the elapse of this predetermined lock time as measured from $t_0$.

The read circuit 34 uses the clock signal to sample the read signal. Specifically, a first analog-to-digital (A/D) converter 40 of the read circuit 34 generates respective samples A/D-0 of the read signal on the rising clock edges, and a second A/D converter 42 generates respective samples A/D-1 of the read signal on the falling clock edges. A finite-impulse-response (FIR) filter 43 equalizes the samples A/D-0 and A/D-1 in a conventional manner to generate respective equalized read-signal samples B0 and B1 on the rising and falling clock edges, respectively. The sync circuit 36 simultaneously processes two respective samples B0 and B1 on each rising clock edge.

Still referring to FIGS. 3 and 4 and, as discussed below in conjunction with FIG. 9, in one embodiment, if the state transitions of the sync circuit 36 are improperly aligned to the read signal as the read head reads the preamble, then the alignment circuit 37 forces the circuit 36 into proper alignment. One can program the circuit 36 to begin operating in response to the first rising clock edge after $t_0$, or in response to the first rising clock edge after the clock-locked time $t_1$. Once the circuit 36 begins operating, the alignment circuit 37 determines the alignment of the circuit 36 state transitions with respect to the read signal. If the circuit 37 determines that this alignment is proper, then it does nothing. Conversely, if the circuit 37 determines that this alignment is improper, then it delays the execution of the circuit 36 state transitions until the circuit 36 is in proper alignment with the read signal.

FIG. 5 is a timing diagram of the read, clock, and synchronization signals of FIG. 3 during reading of the data according to an embodiment of the invention. After the read head (not shown in FIG. 3) finishes reading the preamble, it reads the sync mark, which identifies the rising clock edge at time $t_2$. Time $t_2$ corresponds to the read head reading and the read circuit 36 sampling the first bit of data in the data sector. In response to this rising clock edge at $t_2$, the A/D converter 40 generates a sample A/D-0 that corresponds to the first data bit. Likewise, in response to the subsequent falling clock edge at $t_3$, the A/D converter 42 generates a sample A/D-1 that corresponds to the second data bit. Next, in response to the rising and falling clock edges $t_4$ and $t_5$, the FIR filter 43 generates samples B0 and B1 that respectively correspond to the first and second data bits. Consequently, to insure that these first two bits of data are recovered, the Viterbi detector 38 begins its data-recovery routine on the subsequent rising clock edge at $t_6$. Therefore, as discussed below in conjunction with FIGS. 10A–21, the sync circuit 36 recovers the first-data-sample time $t_2$ from the sync mark and transitions the Viterbi sync signal from one logic level to the other—from logic 0 to logic 1 in this embodiment—in response to the next rising clock edge at $t_4$. In response to this transition of the Viterbi sync signal, the Viterbi detector 38 begins recovering the data on the next rising clock edge at $t_6$. The detector 38 has a latency, which is a delay from the time $t_6$ to a time $t_7$ at which the detector 38 provides the recovered first and second data bits at its output. In one embodiment, the latency is twenty four clock cycles, i.e., forty eight bits. Therefore, in response to the rising clock edge at $t_7$, the sync circuit 36 transitions the detector sync signal from one logic level to the other—from logic 0 to logic 1 in this embodiment. In one embodiment, the sync circuit 36 is programmed with the latency of the detector 38 such that it transitions the Viterbi sync signal, waits the number of clock cycles equal to the latency, and then transitions the detector sync signal if and only if it has previously transitioned the Viterbi sync signal. In response to this transition of the detector sync signal, the decoder 39 begins decoding the recovered data at the next rising clock edge at time $t_8$.

Still referring to FIGS. 3 and 5, although the FIR filter 43 is described as introducing a delay of one clock cycle between the generation of A/D-0, A/D-1 and B0, B1 respectively, it may introduce a different delay. For example, in one embodiment, the filter 43 introduces a delay of three clock cycles. But regardless of the length of this delay, the sync circuit 36 transitions the Viterbi sync signal in response to the rising clock edge ($t_4$) at which the filter 43 generates the sample B0 corresponding to the first data bit, and transitions the detector sync signal in response to the rising clock edge ($t_7$) at which the Viterbi detector 38 generates the first recovered data bit.

Figure 6:
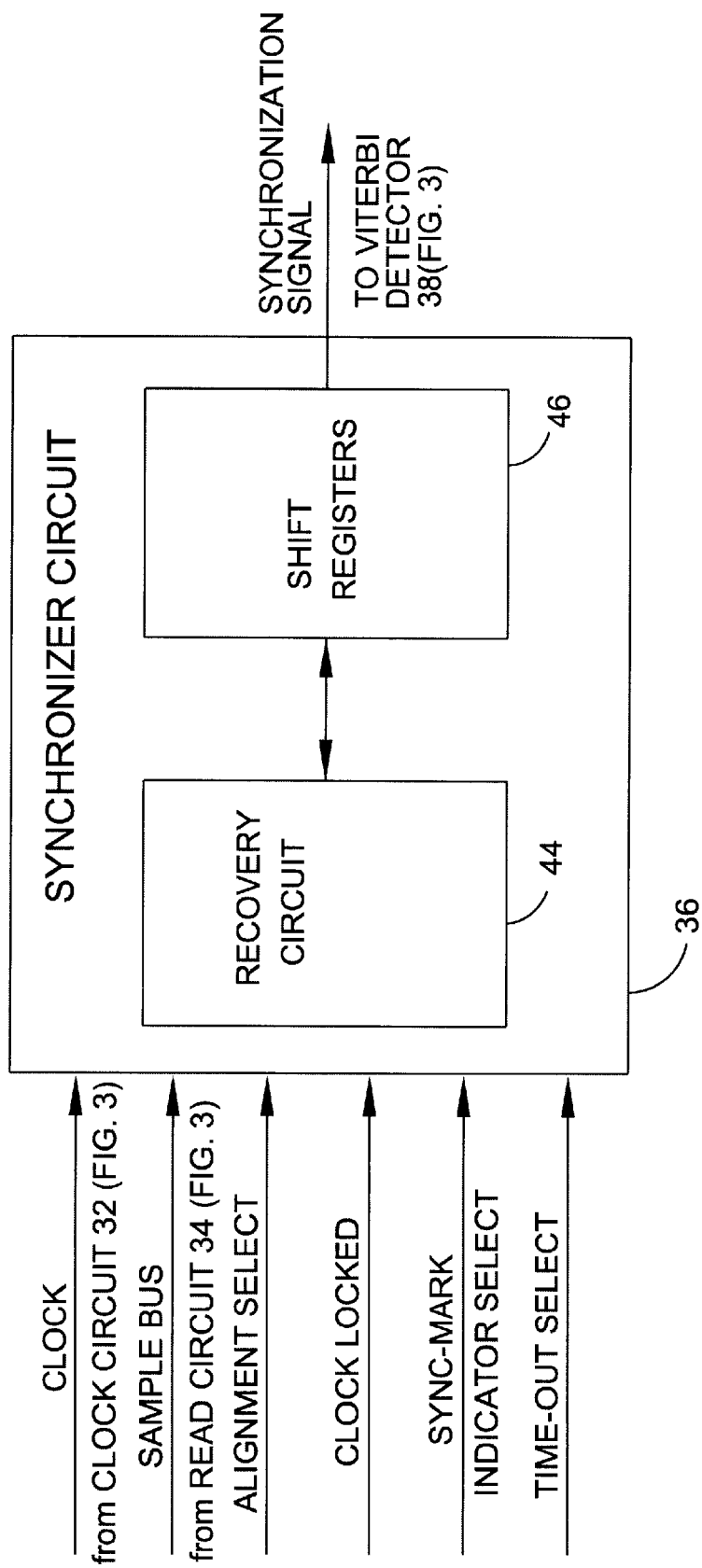
FIG. 6 is a block diagram of the sync circuit of FIG. 3 according to an embodiment of the invention.

FIG. 6 is a block diagram of the synchronizer circuit 36 of FIG. 3 according to an embodiment of the invention. The circuit 36 includes a recovery circuit 44 for tracking the preamble and sync mark of the read signal, for recovering the first-data-sample time $t_2$ (FIG. 5) from the sync mark, and for generating a sync indicator. The circuit 36 also includes shift registers 46 for storing the sync indicator. The circuit 36 transitions the Viterbi sync signal in response to the stored sync indicator as discussed below in conjunction with FIGS. 10A–20B. In addition to receiving the clock and clock-locked signals from the clock circuit 32, the sample B0 and B1 from the read circuit 34 via the sample bus, and the alignment signal from the alignment circuit 37, the circuit 36 receives sync-indicator-select and time-out-select signals. As discussed below in conjunction with FIGS. 10A–21, the sync-indicator-select signal is a logic signal that, depending on its state, causes the circuit 36 to generate the Viterbi sync signal in response to a partially generated sync indicator or in response to only a fully generated sync indicator. And as discussed below in conjunction with FIGS. 10–21, the time-out-select signal is a logic signal having an active state that causes the circuit 36 to halt generation of the Viterbi and detector sync signals if the recovery circuit 44 fails to generate the sync indicator within a predetermined time period.

Referring to FIGS. 7–21, the operation of the synchronizer circuit 36 of FIG. 6 is discussed according to an embodiment of the invention.

Figure 7:
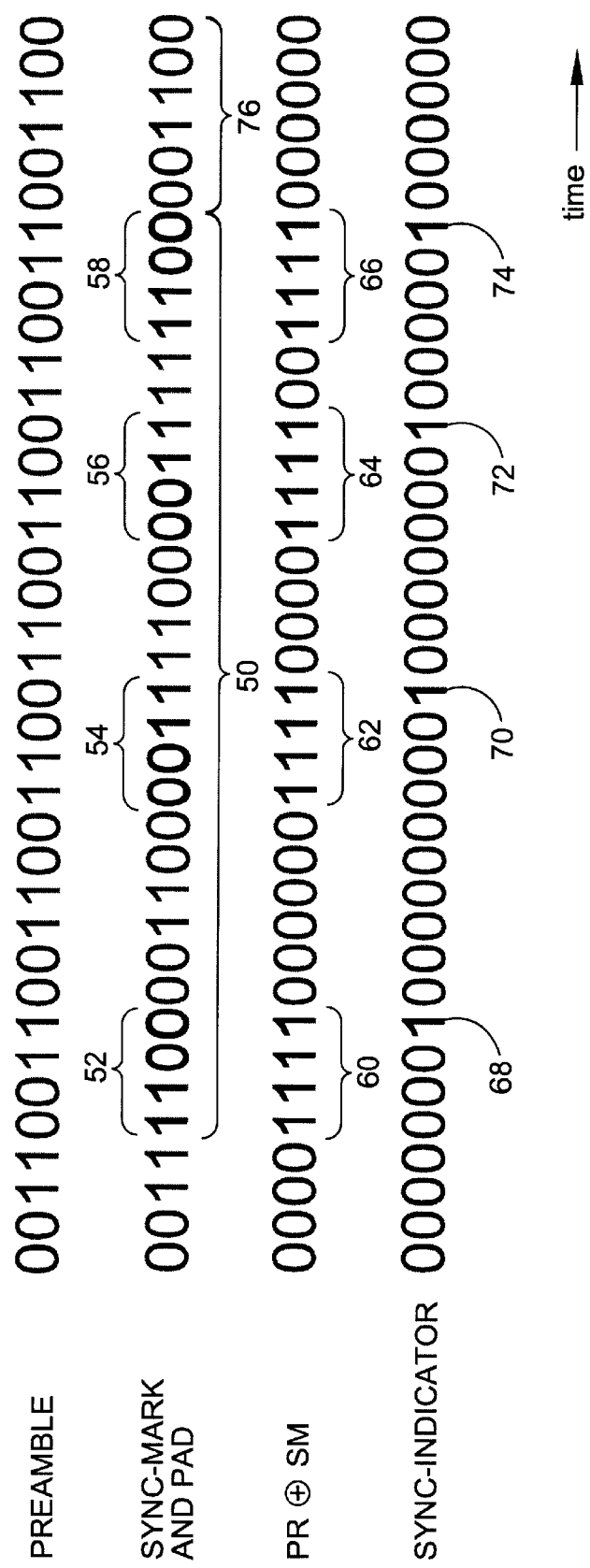
FIG. 7 is a diagram of a preamble, sync mark, pad, and sync indicator according to an embodiment of the invention.

FIG. 7 is a diagram of a preamble, sync mark, and pad according to an embodiment of the invention, and sync indicator generated by the synchronizer circuit 36 (FIG. 6) according to an embodiment of the invention. The preamble has the same bit pattern, 00110011 . . . , as discussed above in conjunction with FIG. 4. The sync mark 50 includes four groups 52, 54, 56, and 58 of four bits that are inverted with respect to the preamble. The number of non-inverted separator bits between adjacent groups decreases as the sync mark progresses. Specifically, there are six separator bits between the groups 52 and 54, four separator bits between the groups 54 and 56, and two separator bits between the groups 56 and 58. These different separations allow the circuit 36 to identify the beginning and end of the sync mark. One can highlight the groups 52, 54, 56, and 58 by XORing the preamble pattern and the sync mark 50 (PR $\oplus$ SM). PR $\oplus$ SM includes all logic 0's except for four groups 60, 62, 64, and 66 of logic 1's, which respectively correspond to the inverted groups 52, 54, 56, and 58 of the sync mark 50. The sync indicator includes four indicator bits 68, 70, 72, and 74—logic 1's in this embodiment—which respectively correspond to the last bits in the groups 52, 54, 56, and 58 of the sync mark. Consequently, nine bits—logic 0's in this embodiment—separate the indicator bits 68 and 70, seven bits separate the indicator bits 70 and 72, and five bits separate the indicator bits 72 and 74.

Figure 2:
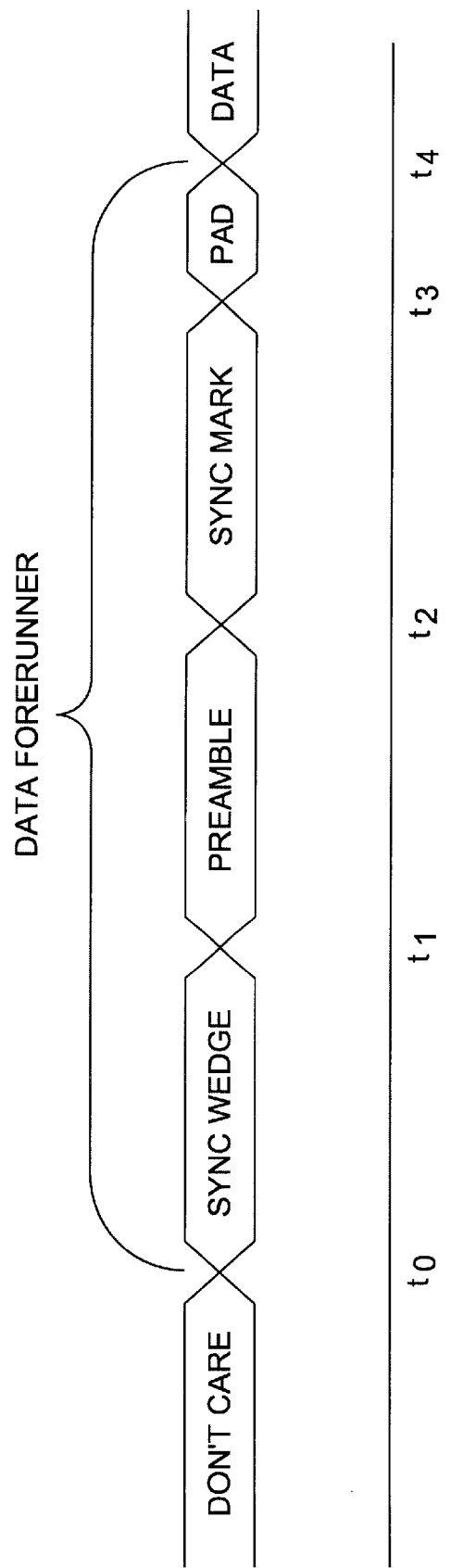
FIG. 2 is a timing diagram of the data forerunner and the data in the order read from the disk of FIG. 1 according to the prior art.

Referring to FIGS. 6 and 7, once the synchronizer circuit 36 has recovered the sync mark and has thus generated the sync indicator, it generates the Viterbi and detector sync signals as discussed above in conjunction with FIG. 5. Specifically, the circuit 36 is programmed to generate the Viterbi sync signal on the first rising clock edge after the read head (not shown in FIGS. 6 or 7) reads the pad 76, which is six bits long in one embodiment. Because the circuit 36 processes two samples B0 and B1 per clock cycle (FIG. 3), and because each sample corresponds to a respective bit of the data forerunner (FIG. 2), there are three rising clock edges within the pad 76. Therefore, the circuit 36 transitions the Viterbi sync signal in response to the third rising clock edge after generating the last indicator bit 74 of the sync indicator. The circuit 36 then waits the latency period of the Viterbi detector 38 before transitioning the detector sync signal. As discussed below in conjunction with FIGS. 10A–21, although all the surviving paths generated by the recovery circuit 44 may not have merged at the indicator bit 74 by this third rising clock edge, typically a sufficient number of the paths have merged to warrant accurately timed transitions of the Viterbi and detector sync signals. Alternatively, the pad 76 can be lengthened to equal or exceed the latency of the recovery circuit 44 so that all the paths have a chance to merge at the indicator bit 74 before the circuit 36 transitions the Viterbi sync signal. Although this latter procedure is more reliable, the former procedure allows the pad 76 to have fewer pad bits than many prior pads, and thus allows the respective data sector to hold more data bits.

Still referring to FIGS. 6 and 7 and as discussed above in conjunction with FIG. 6, one embodiment of the synchronizer circuit 36 has a partial-sync-mark-recovery mode that, when enabled, causes the circuit 36 to transition the Viterbi and detector sync signals even if the recovery circuit 44 has recovered only part of the sync mark, and thus has generated only part of the sync indicator. Specifically, if the sync-indicator-select signal has an inactive state, then the partialsync-mark-recovery mode is disabled such that the circuit 36 transitions the Viterbi and detector sync signals only if the recovery circuit 44 generates the entire sync indicator as discussed in the preceding paragraph. Conversely, if the sync-indicator-select signal has an active state, then the partial-sync-mark-recovery mode is enabled such that the circuit 36 transitions the Viterbi and detector sync signals if the circuit 44 generates at least three of the indicator bits 68, 70, 72, and 74 and the separator bits in between. The inventors have found that generating the three of the four indicator bits and the separator bits in between still yields a reasonably accurate recovery of the sync mark, and thus yields reasonably accurate transitions of the Viterbi and detector sync signals.

For example, if the circuit generates the indicator bits 68, 70, and 72 and the separator bits in between and the partial-sync-mark-recovery mode is enabled, then the circuit 36 transitions the Viterbi sync signal on the third rising clock edge during the reading of the pad 76. Thus, the failure of the recovery circuit 44 to generate one of the indicator bits does not prevent the circuit 36 from transitioning the Viterbi or detector sync signals. One reason that the circuit 44 may fail to generate an indicator bit is a read-signal SNR that is too low during the reading of the sync mark.

Also as discussed above in conjunction with FIG. 6, one embodiment of the synchronization circuit 36 has a time-out mode that, when enabled, causes the circuit 36 to stop searching for the sync mark and to disable the transitioning of the Viterbi and detector sync signals after a predetermined time has elapsed. This prevents erroneous detection of the sync mark while the read head is reading the data. Specifically, if the time-out-select signal has an inactive state, then the time-out mode is disabled such that the circuit 36 searches for the sync mark until the recovery circuit 44 recovers the mark or until a control circuit (not shown in FIG. 6) disables the circuit 36. If, however, the circuit 44 fails to recover the sync mark from the data forerunner as discussed in the preceding two paragraphs, it may recover a false sync mark within the data, particularly if the data includes a pattern that is similar or identical to the sync mark. Conversely, if the time-out-select signal has an active state, then the time-out mode is enabled such that after the recovery circuit 44 generates all but one of the required indicator bits 68, 70, 72, and 74, the circuit 36 disables the circuit 44 and does not transition the Viterbi or detector sync signals unless the circuit 44 generates a remaining indicator bit within a predetermined time period. In one embodiment, this time period is equivalent to thirty bits, i.e., fifteen clock cycles, measured from the generation of the penultimate indicator bit. For example, suppose that the partial-sync-mark-recovery and time-out modes are enabled such that the circuit 36 transitions the Viterbi and detector sync signals if the circuit 44 generates any three of the indicator bits 68, 70, 72, and 74. Furthermore, suppose that the recovery circuit 44 recovers the inverted groups 52 and 54 of the synchronization mark and thus generates the indicator bits 68 and 70. If the circuit 44 does not recover at least one of the groups 56 and 58, and thus does not generate at least one of the indicator bits 72 and 74, within fifteen clock cycles, then it stops searching for the sync mark, and the circuit 36 does not transition the Viterbi or detector sync signals. After a predetermined system time out, a disk-drive control circuit (not shown in FIG. 6) instructs the read channel 30 (FIG. 3) to reread the data sector. This saves time, because the control circuit starts the reread sooner than if the circuit 44 recovered a false sync mark, the sync circuit 36 transitioned the Viterbi and detector sync signals at inaccurate times, the Viterbi detector 38 (FIG. 3) generated a fatal read error, and the control circuit performed the error-detection/correction procedures before it detected the fatal error and forced a sector reread.

Still referring to FIG. 7, the preamble, sync mark 50, pad 76, and the sync indicator may have different patterns than those illustrated. For example, the mark 50 may have more or fewer than twenty eight bits and the groups 52, 54, 56, and 58 may be separated by different numbers of bits. In addition, the pad may have more or fewer than six bits.

Figure 8:
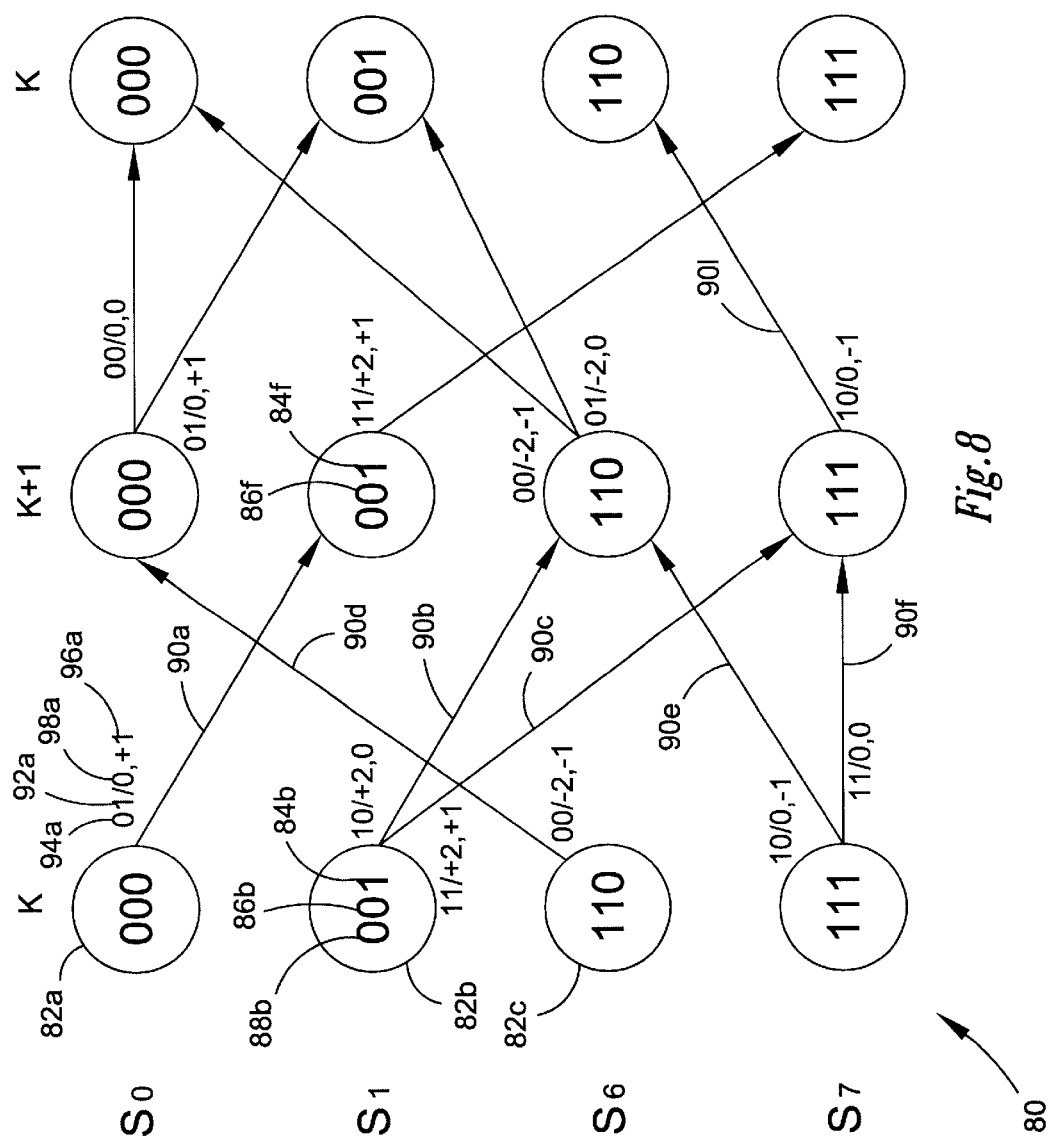
FIG. 8 is a trellis diagram for the sync circuit of FIG. 6 according to an embodiment of the invention.

FIG. 8 is a time-varying trellis diagram 80, which represents a sync-mark-recovery/sync-indicator-generation algorithm that the recovery circuit 44 of FIG. 6 executes according to an embodiment of the invention. This algorithm is compatible with an EPR4 data-recovery protocol, and is similar to recovery algorithms implemented by conventional Viterbi detectors. Heretofore incorporated U.S. patent application Ser. No. 09/409,923 includes a detailed description of the EPR4 data-recovery protocol and the operation of EPR4-compatible Viterbi detectors. For brevity, this description is not repeated here.

Still referring to the trellis 80 of FIG. 8, at each relative sample time k–k+1, the three most recent bits of the binary data forerunner have one of four possible states S: S0=000, S1=001, S6=110, and S7=111. Because the trellis 80 is designed for the preamble, sync mark, and pad of FIG. 7 and because the state transitions of the circuit 44 (FIG. 6) are aligned with the read signal as discussed below in conjunction with FIG. 9, the data forerunner does not have the states S2=101, S3=011, S4=100, and S5=101. Therefore, the states S2–S5 are omitted from the trellis 80. This significantly simplifies the trellis 80 and the recovery circuit 44. The trellis 80 includes one column of state circles 82 for each respective sample time k–k+1. Within each circle 82, the right-most bit 84 represents a possible value for the most recent bit of the data forerunner at the respective sample time, the middle bit 86 represents a possible value for the second most recent bit of the data forerunner, and the left-most bit 88 represents a possible value for the third most recent bit of the data forerunner. Because the recovery circuit 44 process two samples B0 and B1 at each sample time k and k+1, the bits 84 and 86 within each circle 82 are the most recent bits corresponding to the respective sample time k and k+1. For example, in the circle 82b, the bits 84b, 86b, and 88b represent the possible values—logic 1, logic 0, and logic 0, respectively—for the three most recent bits of the data forerunner at sample time k. The recovery circuit 44 processes the samples B0 and B1 respectively corresponding to the bits 84b and 86b during the sample time k, and processes the sample B1 corresponding to the bit 88b during the previous to the sample time.

Furthermore, a finite number of potential state transitions exist between the states S atone sample time k–k+1 of the trellis 80 and the states S at the next respective sample time. "Branches" 90 represent these possible state transitions. For example, starting at the possible state S0 (circle 82a) at sample time k, the only choice for the next state S at k+1 is S1 (circle 82f). Thus, the branch 90a represents this possible state transition. Because the patterns of the preamble, sync mark, and pad are known, some of the possible branches are omitted from the trellis 80. This omission further simplifies the trellis 80 and the recovery circuit 44 (FIG. 6). In addition, the branches 90a and 90l, which are in bold line, represent the two state transitions for which the recovery circuit 44 generates a potential indicator bit 68, 70, 72, or 74 (FIG. 7) as discussed below in conjunction with FIGS. 10A–21.

The trellis 80 also includes respective state-transition labels for clarity. Specifically, the values 92 and 94 are the respective values of the next two data-forerunner bits 84 and 86 that the respective branch 90 points to, and the values 96 and 98 are the respective values of the corresponding samples B1 and B0. For example, for the state transition represented by the branch 90a, the values 92a and 94a respectively represent the bits 84f and 86f, and thus respectively equal logic 1 and logic 0, and the corresponding sample values 96a (B1) and 98a (B0) respectively equal +1 and 0, respectively.

Still referring to FIG. 8, as the recovery circuit 44 (FIG. 6) traverses the trellis 80, it calculates the branch metrics and updates the path metrics in a conventional manner such as that described in U.S. Pat. No. 5,430,744, "Method and Means for Detecting Partial Response Waveforms Using A Modified Dynamic Programming Heuristic," which is incorporated by reference.

Referring to FIGS. 3, 4, 8, and 9, in one embodiment, the synchronizer circuit 36 aligns the state transitions executed by the recovery circuit 44 (FIG. 6) and represented by the trellis 80 with the data forerunner to promote accurate recovery of the sync mark and accurate generation of the sync indicator.

Figure 9:
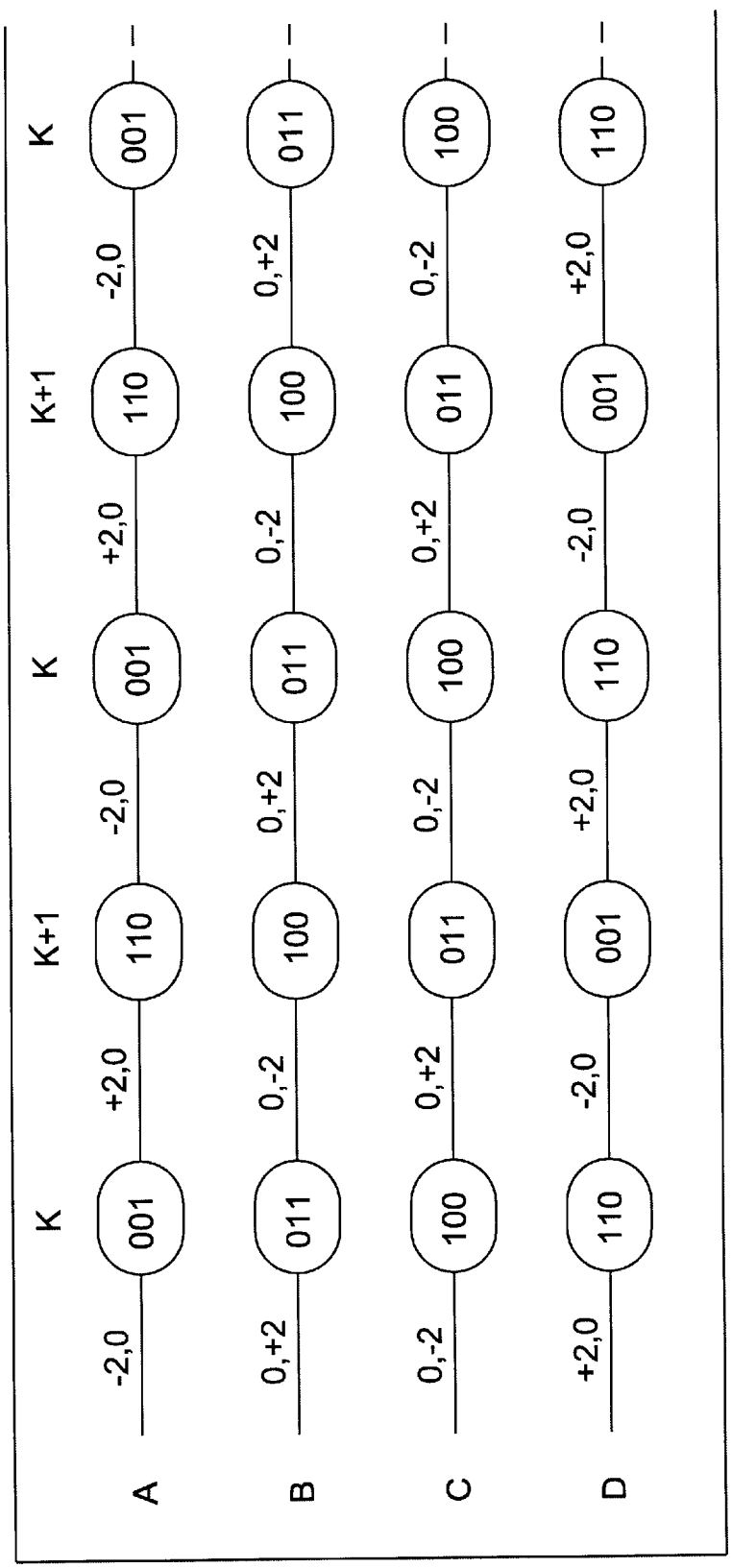
FIG. 9 is a diagram of the possible sequences that the recovery circuit of FIG. 6 can traverse through the trellis diagram of FIG. 8 during the reading of the preamble of FIG. 7.

FIG. 9 is a diagram of the possible state-transition sequences A–D that the recovery circuit 44 (FIG. 6) can traverse through the trellis 80 while the read head reads the preamble of FIG. 7. Referring to FIG. 4, the traversed sequence depends on the value of the read signal, and thus the value of the preamble, at the first rising clock edge after time $t_0$ or $t_1$, depending on whether the synchronizer circuit 36 is programmed to begin operation before or after the transition of the clock-locked signal. For example purposes the former case is discussed, it being understood that operation of the circuit 36 in the latter case is similar.

Referring to FIG. 8, the first rising clock edge after $t_0$ causes the recovery circuit 44 to execute a transition from the states S at sample time k to the states S at k+1. Likewise, the second rising clock edge after $t_0$ causes the recovery circuit 44 to execute a transition from the states S at k+1 to the states S at k. These first and second state transitions are "junk" transitions because the sync circuit 36 processes inaccurate samples B0 and B1 during the first transition and an inaccurate sample B0 during the second transition. This is due to the pipe-line delay of the read circuit 34. Assuming that the alignment between the clock signal and the read signal is as shown in FIG. 4 and assuming a noiseless read signal, the first rising clock edge causes the A/D 40 to generate A/D-0=−2, and the following falling clock edge causes the A/D 42 to generate A/D-1=0. Similarly, the second rising clock edge causes the FIR filter 43 to generate B0=−2, and the following falling clock edge causes the filter 43 to generate B1=0. Therefore, on the third rising clock edge after $t_0$, the recovery circuit 44 executes a transition from the states S at k+1 to the states S at k with B0=−2 and B1=0. According to the trellis 80, these values for B0 and B1 indicate that the preamble has the state S1 at sample time k. Thus, in this example, the recovery circuit 44 traverses the trellis 80 via the sequence A.

In one embodiment, the synchronizer circuit 36 aligns the state transitions of the recovery circuit 44 with the preamble such that the recovery circuit 44 traverses the trellis 80 (FIG. 8) via the sequence A. As discussed below in conjunction with FIGS. 10A–21, this alignment insures that the recovery circuit 44 accurately recovers the sync mark and generates the sync indicator (FIG. 7), Referring to FIGS. 4 and 9, because the clock circuit 32 (FIG. 3) generates the first falling clock edge at time $t_0$ in response to a zero crossing of the read signal, then, absent some peculiar glitch, the recovery circuit 44 traverses the trellis 80 via the sequence A or the sequence D. For example, as discussed above, if the clock signal is aligned with the read signal as shown in FIG. 4, then the circuit 44 traverses the trellis 80 via the sequence A. In this alignment, the first falling clock edge is aligned with a negative-slope zero crossing of the read signal between +2 and −2. Conversely, if the first falling clock edge is shifted 180° with respect to the read signal and thus is aligned with a positive-slope zero crossing between −2 and +2, then the circuit 44 traverses the trellis 80 via the sequence D.

Referring to FIGS. 3 and 9, the alignment circuit 37 determines the alignment of the state transitions of the recovery circuit 44 with respect to the preamble and, if necessary, realigns these state transitions so that the circuit 44 traverses the trellis 80 via the sequence A.

To determine the alignment of the circuit 44 state transitions, the circuit 37 implements the following equation:

$$\text{Count}=\text{Count}+\text{sign}(B0)\times(-1)^{CC} \quad (1)$$

where Count is initialized to equal 0, CC is the number of the clock cycle, and sign(B0) is the polarity of the sample B0 taken at the rising clock edge that begins the clock cycle CC. If the circuit 44 is traversing the trellis 80 via the sequence A, then, after a number of clock cycles CC, Count will equal a positive value. Conversely, if the circuit 44 is traversing the trellis 80 via the sequence D, then, after a number of clock cycles CC, Count will equal a negative value. For example, referring to FIG. 4, the first rising clock edge after time $t_0$ represents the beginning of the clock cycle corresponding to CC=1. On the third rising clock edge after $t_0$ corresponding to CC=3, the alignment circuit 37 processes B0=−2 from the FIR filter 43, and according to equation (1), Count=0+−$(-1)^3$=+1. (As discussed above in conjunction with FIG. 5, the first valid sample B0=−2 is unavailable to the circuit 37 until the third rising clock edge because of the pipeline delays introduced by the A/D converters 40 and 42 and the FIR filter 43.) On the fourth rising clock edge, CC=4, B0=+2, and Count=1+$(-1)^4$=+2. On the fifth rising clock edge, CC=5, B0=−2, and Count=2+−$(-1)^5$=+3. Therefore, Count is increasing and eventually becomes a positive number—despite any junk values calculated for Count during clock cycles 1 and 2—when the circuit 44 traverses the trellis 80 via the sequence A. Conversely, if the clock signal of FIG. 4 is shifted 180° with respect to the read signal, then the circuit 44 traverses the trellis 80 via the sequence D and Count is decreasing and eventually becomes a negative number. Therefore, after a predetermined number of clock cycles, the alignment circuit 37 analyzes the polarity of Count. If Count equals a positive number, then the circuit 37 determines that the state transitions of the recovery circuit 44 are properly aligned with the preamble and thus does not realign the circuit 44. Conversely, if Count equals a negative number, then the circuit 37 determines that the state-transitions of the recovery circuit 44 are improperly aligned with the preamble and thus realigns the circuit 44 as discussed below.

The above-described analysis of equation (1) is valid as long as CC has the above-disclosed relationship with the sample clock. Specifically, the analysis is valid as long as CC equals an odd number for the clock cycle during which the alignment circuit 37 processes the first valid sample B0 of the preamble. CC has this characteristic as long as the combined pipeline delay introduced by the A/D converters 40 and 42 and the FIR filter 43 is an even number of clock cycles. For example, in the above-described analysis of equation (1), this combined pipeline delay is two clock cycles.

If CC has a different relationship with the sample clock, then the alignment circuit 37 can implement a modified version of equation (1) or a modified analysis thereof to obtain accurate alignment information. For example, suppose the pipeline delay introduced by the A/D converters 40 and 42 and the FIR filter 43 is an odd number of clock cycles. Consequently, CC equals an even number for the clock cycle during which the alignment circuit 37 processes the first valid sample B0 of the preamble. This causes Count to equal a negative value if the state transitions of the recovery circuit 44 are properly aligned with the preamble, and causes Count to equal a positive value if the state transitions are improperly aligned. Therefore, one can modify the circuit 37 to interpret a negative Count value as proper alignment and to interpret a positive Count value as improper alignment.

In one embodiment as discussed above, the synchronizer circuit 36 begins operating on the first rising clock edge after $t_0$ (FIG. 4), and thus the circuit 37 is programmed to begin implementing equation (1) starting with this first rising clock and to analyze Count after sixteen clock cycles. Sixteen clock cycles are typically sufficient to allow the clock circuit 32 to properly lock the clock signal to the read signal and to allow the circuit 37 to analyze a sufficient number of samples B0 for an accurate indication of the alignment between the circuit 44 and the preamble.

In another embodiment as discussed above, the circuit 37 is programmed to begin implementing equation (1) starting with the first rising clock edge after $t_1$ (FIG. 4) and to analyze Count after eight clock cycles. Because the clock signal is locked before the circuit 37 implements equation (1), fewer clock cycles are needed—eight instead of sixteen in this embodiment—for an accurate indication of the alignment between the circuit 44 and the preamble.

Still referring to FIGS. 3 and 9, if the alignment circuit 37 determines that the circuit 44 is traversing the trellis 80 via the undesired sequence D, then the circuit 37 realigns the circuit 44 by causing the circuit 44 to skip a state transition. Referring to FIG. 9, the sequences A and D are the same except that they are offset by one sample time. Specifically, the sequence A has the state S1 at sample time k of the trellis 80 and has the state S6 at sample time k+1. Conversely, the sequence D has the state S6 at sample time k and has the state S1 at sample time k+1. Therefore, the circuit 44 can shift between states A and D if it "waits" one clock cycle. For example, suppose the circuit 44 is traversing the trellis 80 via the sequence D and the circuit 44 has just executed a state transition between k and k+1. Therefore, the preamble has the state S1 at k+1. Next, the alignment circuit 37 conventionally prohibits the circuit 44 from executing a state transition between k+1 and k at the next rising clock edge. Therefore, the preamble transitions to the state S6 at this next rising clock edge while the circuit 44 remains at sample time k+1. This is the alignment for the sequence A. Then, the circuit 37 enables the circuit 44 to transition between k+1 and k at the following rising clock edge such that the circuit 44 begins traversing the trellis 80 via the desired sequence A.

Figure 10A:
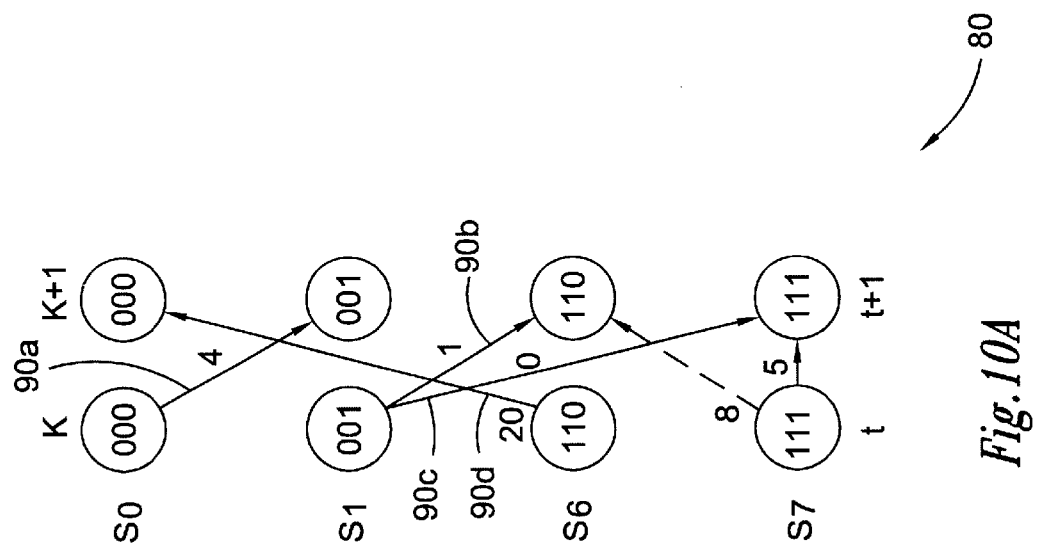
FIG. 10A is the trellis diagram of FIG. 8 at a sample time during the generation of the sync indicator by the sync circuit of FIG. 4 according to an embodiment of the invention.
Figure 10B:
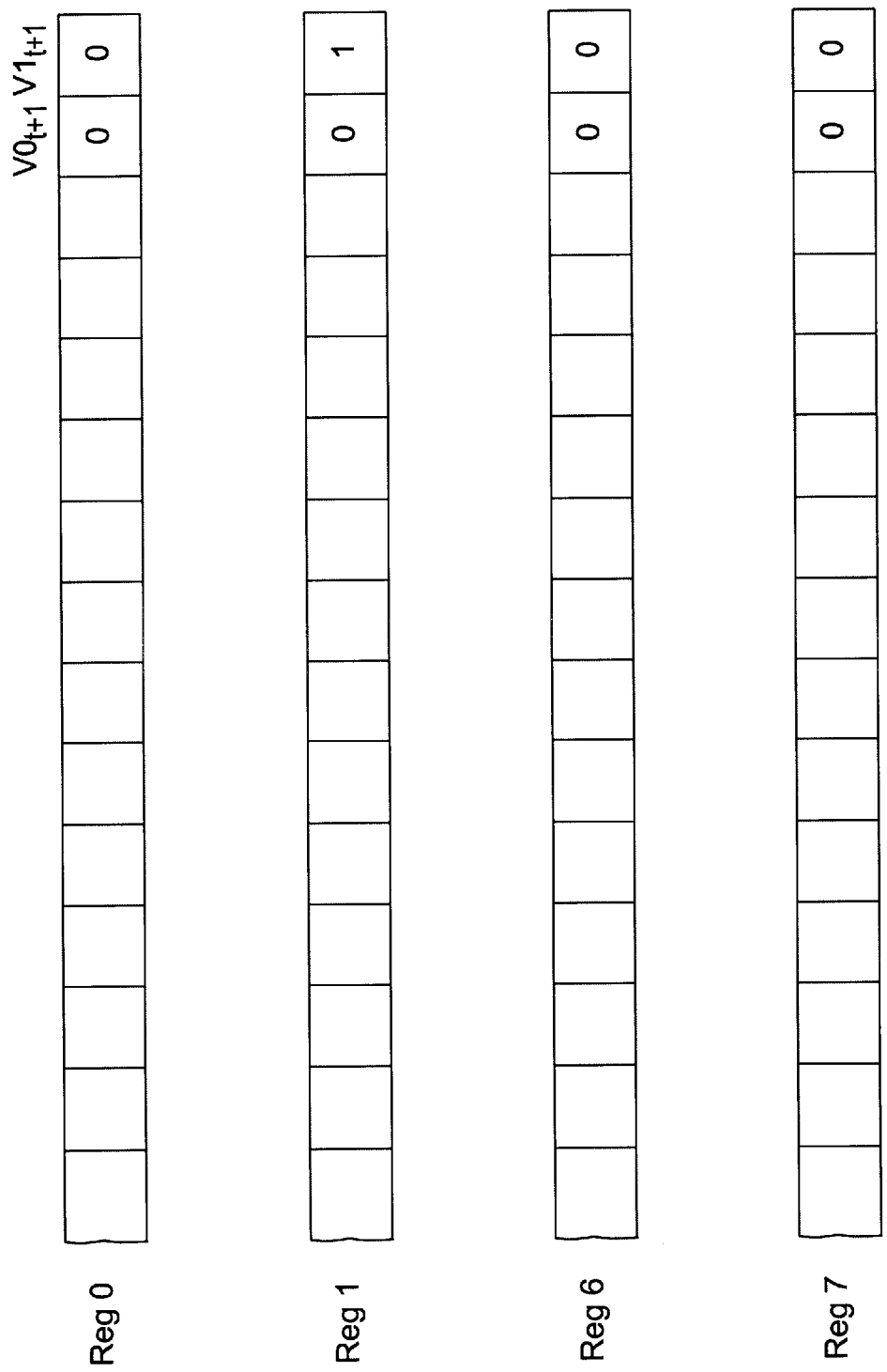
FIG. 10B shows the contents of the sync-circuit shift registers of FIG. 4 corresponding to the trellis diagram of FIG. 10A.
Figure 11A:
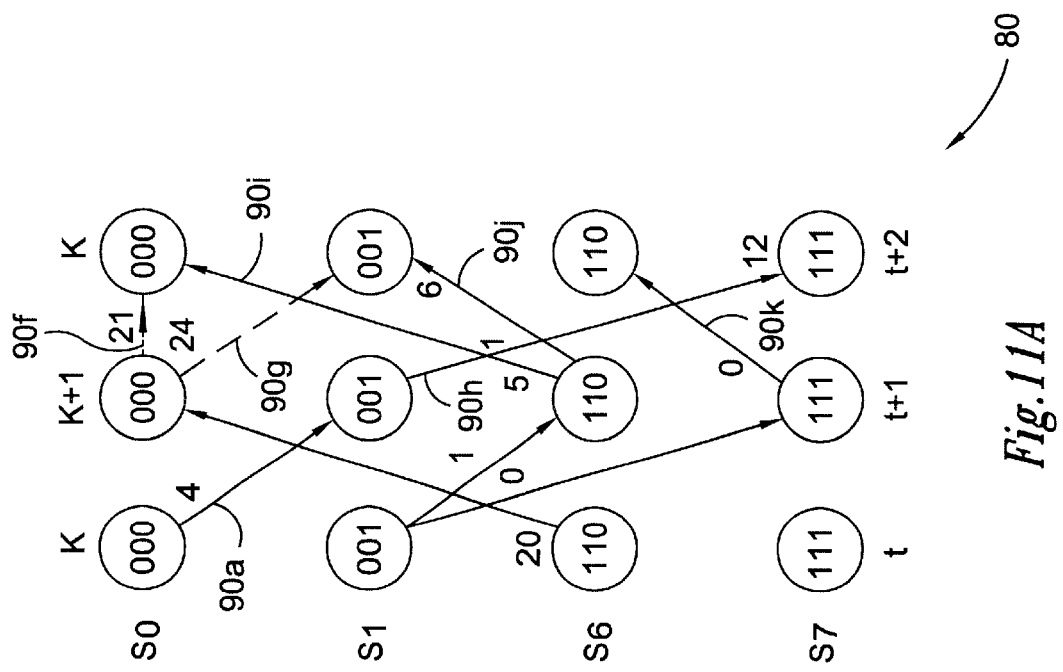
FIG. 11A is the trellis diagram of FIG. 10A at a subsequent sample time.

Referring to FIGS. 10A–21, after the state transitions of the recovery circuit 44 are aligned with the preamble, the circuit 44 recovers the sync mark and generates the sync indicator according to an embodiment of the invention. FIGS. 10A, 11A, . . . , and 21 show an expanded trellis diagram 80 (FIG. 8) and the surviving paths at respective sample times t–t+11, and FIGS. 10B, 11B, . . . , and 20B show the contents of four corresponding shift registers Reg0, Reg1, Reg6, and Reg7—one for each state S0, S1, S6, and S7—at these respective sample times. These registers compose the block of shift registers 46 of FIG. 6. The state-transition branches 90 from the even sample times t, t+2, . . . , t+10 to the respective odd sample times t+1, t+3, . . . , t+11 are the same as the state-transition branches 90 from k to k+1 of FIG. 8. Likewise, the state-transition branches from the odd sample times to the respective even sample times are the same as the state-transition branches 90 from k+1 to k of FIG. 8. For clarity, the sample-time labels "k" and "k+1" show the relationship between the expanded trellis 80 of FIGS. 10A, 11A, . . . , 21 and the trellis 80 of FIG. 8. Furthermore, the circuit 44 left shifts new values into the right sides of Reg0, Reg1, Reg6, and Reg7 as shown in FIGS. 10B, 11B, . . . , 20B.

The recovery circuit 44 operates similarly to the recovery circuit of a conventional Viterbi detector, except that instead of loading the recovered bit sequence—here the sync mark 50 (FIG. 7)—into Reg0, Reg1, Reg6, and Reg7, it generates and loads the sync indicator into these registers. Referring to the trellis 80 (FIG. 8), for all the state transitions represented by the normal-line branches 90, the circuit 44 loads 0, 0 into the respective shift registers. Conversely, for the two state transitions represented by the bold-line branches 90, the circuit 44 loads 0, 1 into the respective shift registers. Because the state transitions of the circuit 44 are aligned with the preamble and remain in this alignment during the reading of the sync mark 50, the contents of Reg0, Reg1, Reg6, and Reg7 will eventually converge to the sync indicator (FIG. 7).

For purposes of illustration, the sample time t of FIGS. 10A, 11A, . . . , 21 corresponds to the bits 01 of the preamble (FIG. 7) that immediately precede the first inverted group 52 (FIG. 7) of the sync mark 50. Consequently, the sample time t+1 corresponds to the last bit 1 of the preamble and the first bit 1 of the group 52. This starting point coincides with the circuit 44 traversing the trellis 80 via the sequence A (FIG. 9) of the preamble because the preamble has the state S1 at sample time t, which coincides with the relative sample time k.

Also for purposes of illustration, it is assumed that the read signal is noiseless such that read circuit 34 (FIG. 3) generates ideal values for the samples B0 and B1. Because the sync mark 50 is known, these ideal samples B0 and B1 are also known. Therefore, the ideal branch metrics are calculated using these ideal samples according to the following known equation:

$$X = (B0_{IDEAL} - B0_{BRANCH})^2 + (B1_{IDEAL} - B1_{BRANCH})^2 \qquad (2)$$

where $B0_{BRANCH}$ and $B1_{BRANCH}$ are the respective sample values 94 and 92 assigned to the branches 90 of FIG. 8. The respective ideal path metric for each state S merely equals the sums of the respective ideal branch metrics of the surviving path through the state S at the current sampling time. For clarity, the values of these ideal path metrics label the branches of the respective paths for each state transition in FIGS. 10A, 11A, . . . , 21.

Referring to FIG. 10A, the recovery circuit 44 (FIG. 6) receives the ideal samples $B0_{IDEAL}$ and $B1_{IDEAL}$ corresponding to the sample time t+1. Referring to FIG. 7, the two bits represented by the read signal at sample time t+1 are logic 1, logic 1, which respectively correspond to the bit before and the first bit of the inverted group 52. $B0_{IDEAL}$ and $B1_{IDEAL}$ are calculated as follows: $B0_{IDEAL}=1+1-0-0=+2$, and $B1_{IDEAL}=1+1-1-0=+1$. These calculations are based on the conventional EPR4 sample/bit equation $$B = A_t + A_{t-1} - A_{t-2} - A_{t-3} \quad (3)$$

which is disclosed in heretofore incorporated U.S. patent application Ser. No. 09/409,923. Using $B0_{IDEAL}$ and $B1_{IDEAL}$, the recovery circuit 44 calculates the branch metrics X and updates the path metrics for each of the respective branches 90 between the states S at t and the states S at t+1. The updated path metrics label the respective branches. Because the branch metrics X between the states S at sample times t and t+1 are the first branch metrics calculated in this example, the path metrics equal the branch metrics for all branches. For example, the branch metric X, and thus the path metric, for the branch 90a between S0 at t and S1 at S7 equals 4.

Next, the recovery circuit 44 identifies the shortest path to each state at sample time t+1, i.e., the surviving paths. For example, referring to state S0 at sample time t+1, there is only one incoming path, so it is the surviving path. Conversely, referring to state S6, there are two incoming paths. Therefore, the recovery circuit 44 selects the incoming branch having the smallest path metric—here the path that includes the branch 90b—as the surviving path. For clarity, the surviving paths are shown in solid line, and the eliminated paths are shown in dashed line. Furthermore, the true path that connects the actual states of the read bits—here the path that includes the branch 90c—has a path metric=0 in this ideal example.

Referring to FIG. 10B, once the recovery circuit 44 identifies the surviving paths, it loads the corresponding sync-indicator values V0 and V1 into the respective shift registers Reg0, Reg1, Reg6, and Reg7 of the shift register block 46. Reg0, Reg1, Reg6 and Reg7 respectively correspond to the surviving paths ending at the states S0, S1, S6, and S7. For example, referring to FIG. 10A, the recovery circuit 44 loads $V0_{t+1}=V1_{t+1}=0$ into Reg0, Reg6, and Reg7 because the normal-line surviving branches 90d, 90b, and 90c respectively point to the states S0, S6, and S7. Conversely, the recovery circuit 44 loads $V0_{t+1}=0$ and $V1_{t+1}=1$ into Reg1 because the bold-line surviving branch 90a points to the state S1.

Referring to FIG. 11A, the recovery circuit 44 receives the next samples $B0_{IDEAL}$ and $B1_{IDEAL}$ corresponding to the sample time t+2. Referring to FIG. 7, the next two bits represented by the read signal at sample time t+2 are logic 1 and logic 0, which respectively correspond to the second and third bits of the inverted group 52. Therefore, $B0_{IDEAL}=1+1-1-1=0$, and $B1_{IDEAL}=0+1-1-1=-1$. Using $B0_{IDEAL}$ and $B1_{IDEAL}$, the recovery circuit 44 calculates the branch metrics X and updates the path metrics for each of the respective branches 90 between the states S at t+1 and the states S at t+2. The updated path metrics label the respective branches. For example, the path metric equals 5 for the path that includes the branch 90i between S6 at t+1 and S0 at t+2.

Next, the recovery circuit 44 identifies the surviving path to each state at sample time t+2. For clarity, the surviving paths are shown in solid line, the most recent branches of the newly eliminated paths—here the branches 90f and 90g—are shown in dashed line, and the previously eliminated paths are omitted from the expanded trellis 80. Furthermore, the true path connecting the actual states of the read bits, here the path that includes the branch 90k, has a path metric=0 in this ideal example.

Referring to FIG. 11B, once the recovery circuit 44 identifies the surviving paths, it loads the corresponding sync-indicator values V0 and V1 into the respective shift registers Reg0, Reg1, Reg6, and Reg7 of the shift register block 46. Referring to FIG. 11A, the recovery circuit 44 left shifts $V0_{t+2}=V1_{t+2}=0$ into Reg0, Reg1, and Reg7 because the normal-line surviving branches 90i, 90j, and 90h respectively point to the states S0, S1, and S7. Conversely, the recovery circuit 44 left shifts $V0_{t+2}=0$ and $V1_{t+2}=1$ into Reg6 because the bold-line surviving branch 90k points to the state S6. Furthermore, the surviving path to S6 now passes through S7 at t+1. Therefore, the circuit 44 loads the path history $V0_{t+1}$ and $V1_{t+1}$ from Reg7 into the corresponding locations of Reg6. Likewise, the surviving path to S7 now passes through S1 at t+1. Therefore, the circuit 44 loads the path history $V0_{t+1}$ and $V1_{t+1}$ from Reg1 into the corresponding locations of Reg7. Moreover, the surviving paths to S0 and S1 now pass through S6 at time t+1. Therefore, the circuit 44 loads the path history $V0_{t+1}$ and $V1_{t+1}$ from Reg6 into the corresponding locations of Reg0 and Reg1. The circuit 44 performs these register cross loads in a conventional manner such that the prior path histories are crossloaded and not the updated path histories. For example, if the circuit 44 loaded the path history from Reg6 into Reg1 before it loaded the path history from Reg1 into Reg7, then Reg7 would contain the new path history, not the old path history as is proper, from Reg1.

Figure 12A:
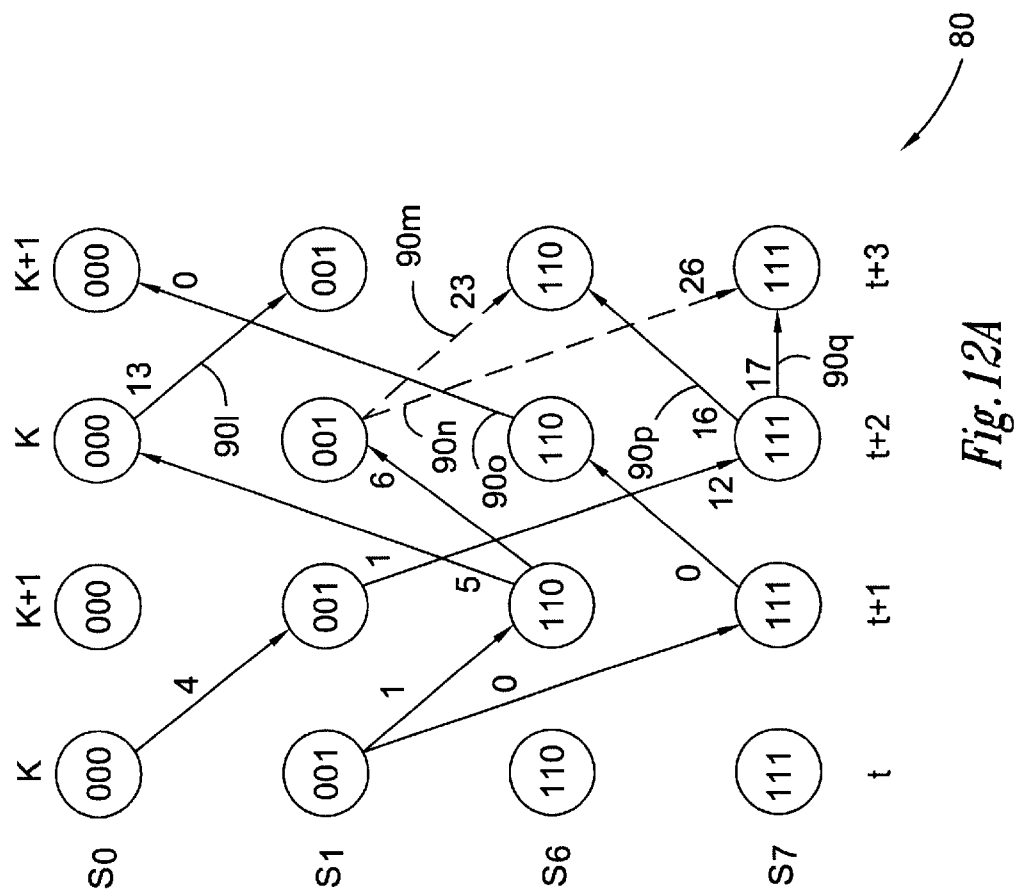
FIG. 12A is the trellis diagram of FIG. 11A at a subsequent sample time.

Referring to FIG. 12A, the recovery circuit 44 receives the next samples $B0_{IDEAL}$ and $B1_{IDEAL}$ corresponding to the sample time t+3. Referring to FIG. 7, the next two bits represented by the read signal at sample time t+3 are logic 0 and logic 0, which respectively correspond to the fourth bit of the inverted group 52 and the first separator bit between the groups 52 and 54. Therefore, $B0_{IDEAL}=0+0-1-1=-2$, and $B1_{IDEAL}=0+0-0-1=-1$. Using $B0_{IDEAL}$ and $B1_{IDEAL}$, the recovery circuit 44 calculates the branch metrics X and updates the path metrics for each of the respective branches 90 between the states S at t+2 and the states S at t+3. The updated path metrics label the respective branches.

Next, the recovery circuit 44 identifies the surviving path to each state at sample time t+3. For clarity, the surviving paths are shown in solid line, the most recent branches of the newly eliminated paths—here the branches 90m and 90n—are shown in dashed line, and the previously eliminated paths are omitted from the expanded trellis 80. Furthermore, the path connecting the actual states of the read bits, here the path that includes the branch 90o, has a path metric=0 in this ideal example.

Referring to FIG. 12B, once the recovery circuit 44 identifies the surviving paths, it loads the corresponding sync-indicator values V0 and V1 into the respective shift registers Reg0, Reg1, Reg6, and Reg7. Referring to FIG. 12A, the recovery circuit 44 left shifts $V0_{t+3}=V1_{t+3}=0$ into Reg0, Reg6, and Reg7 because the normal-line surviving branches 90o, 90p, and 90q respectively point to the states S0, S6, and S7. Conversely, the recovery circuit 44 left shifts $V0_{t+3}=0$ and $V1_{t+3}=1$ into Reg1 because the bold-line surviving branch 90l points to the state S1. Furthermore, the surviving path to S0 now passes through S6 at time t+2. Therefore, the circuit 44 loads the path history $V1_{t+2}$-$V0_{t+1}$ from Reg6 into the corresponding locations of Reg0. Likewise, the surviving path to S1 now passes through S0 at t+2, and thus the circuit 44 loads the path history $V1_{t+2}$-$V0_{t+1}$ from Reg0 into the corresponding locations of Reg1. Moreover, the surviving path to S6 now passes through S7 at t+2, and thus the circuit 44 loads the path history $V1_{t+2}$-$V0_{t+1}$ from Reg7 into the corresponding locations of Reg6. In addition, because the surviving path the S7 now passes through S7 at t+2, no cross loading of Reg7 is necessary.

Figure 13A:
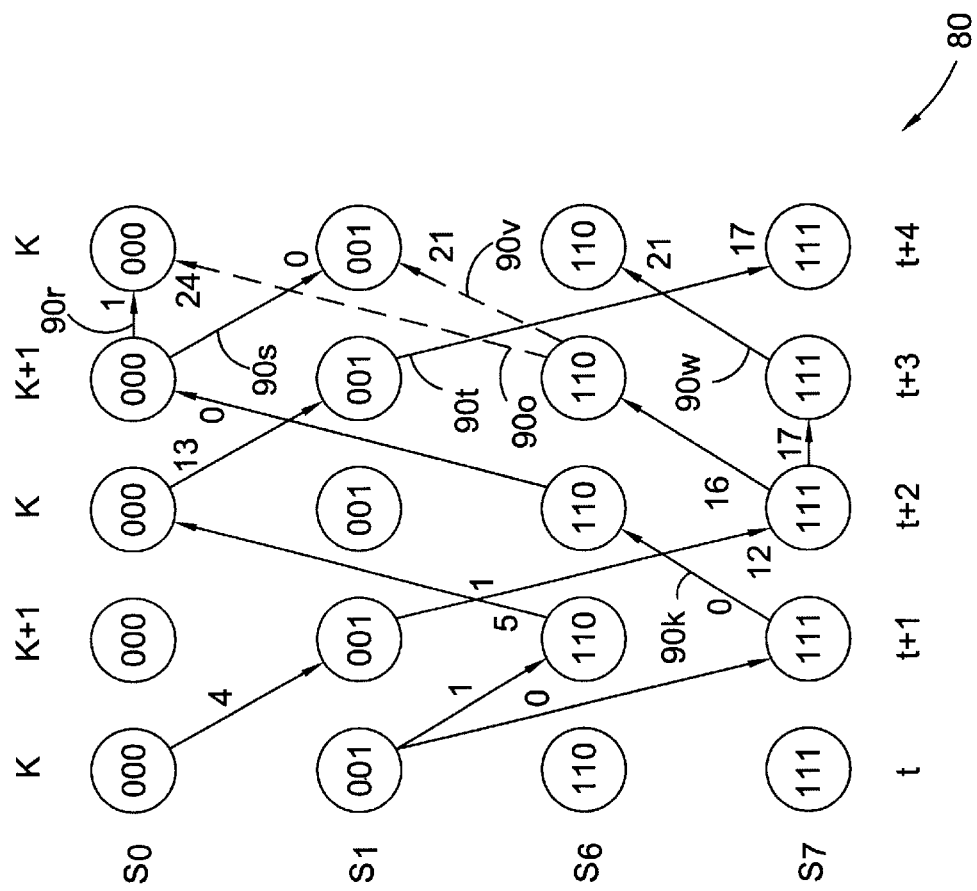
FIG. 13A is the trellis diagram of FIG. 12A at a subsequent sample time.

Referring to FIG. 13A, the recovery circuit 44 receives the next samples $B0_{IDEAL}$ and $B1_{IDEAL}$ corresponding to the sample time t+4. Referring to FIG. 7, the next two bits represented by the read signal at sample time t+4 are logic 0 and logic 1, which respectively correspond to the second and third separator bits between the groups 52 and 54 of the sync mark 50. Therefore, $B0_{IDEAL}$=0+0−0−0=0, and $B1_{IDEAL}$=1+0−0−0=+1. Using $B0_{IDEAL}$ and $B1_{IDEAL}$, the recovery circuit 44 calculates the branch metrics X and updates the path metrics for each of the respective branches 90 between the states S at t+3 and the states S at t+4. The updated path metrics label the respective branches.

Next, the recovery circuit 44 identifies the surviving path to each state at sample time t+4. The path connecting the actual states of the read bits, here the path that includes the branch 90s and into which all the surviving paths will eventually merge, has a path metric=0 in this ideal example.

Figure 13B:
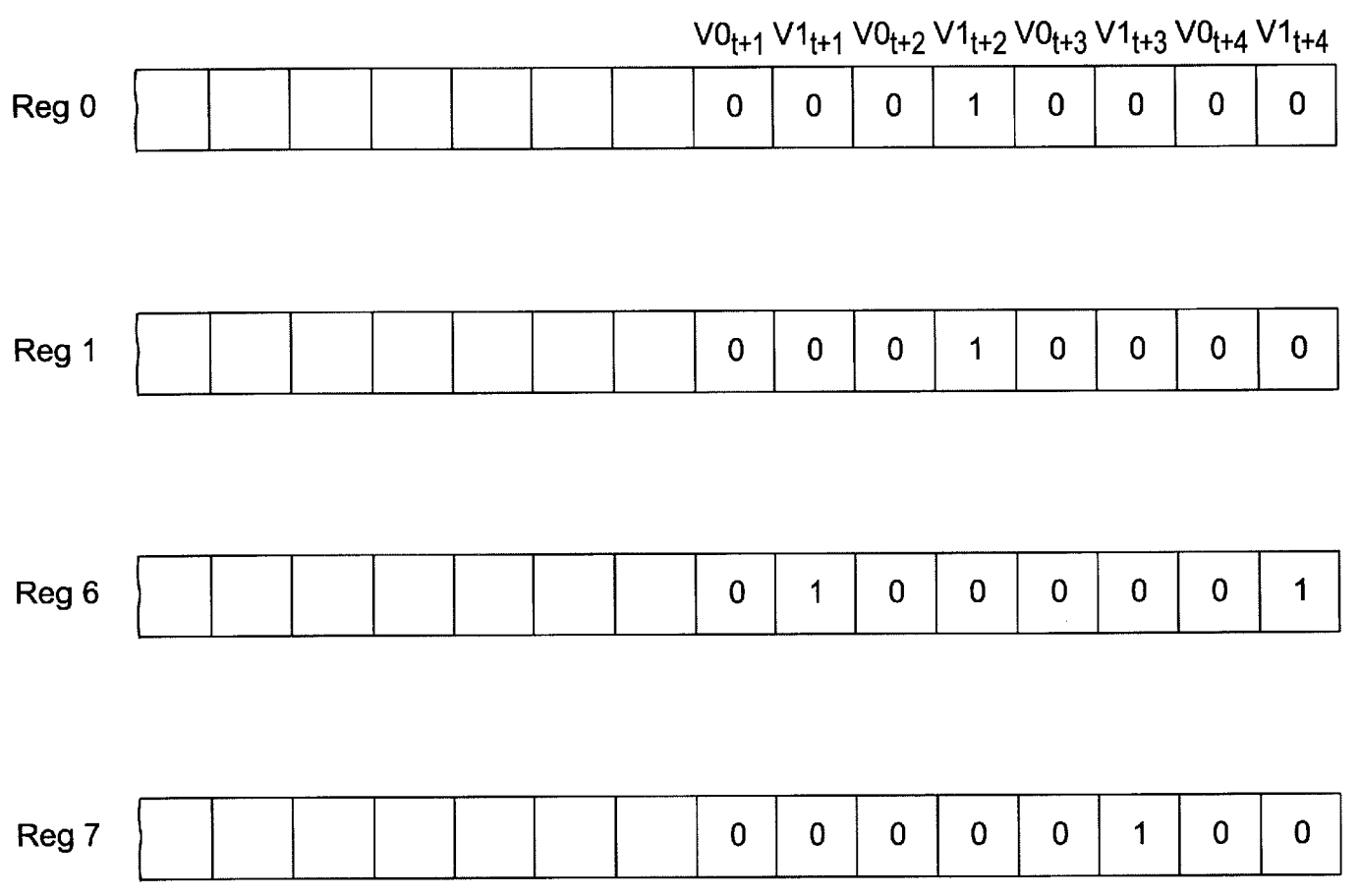

Referring to FIG. 13B, once the recovery circuit 44 identifies the surviving paths, it loads the corresponding sync-indicator values V0 and V1 into the respective shift registers Reg0, Reg1, Reg6, and Reg7. Referring to FIG. 13A, the recovery circuit 44 left shifts $V0_{t+4}$=$V1_{t+4}$=0 into Reg0, Reg1, and Reg7 because the normal-line surviving branches 90r, 90s, and 90t respectively point to the states S0, S1, and S7. Conversely, the recovery circuit 44 left shifts $V0_{t+4}$=0 and $V1_{t+4}$=1 into Reg6 because the bold-line surviving branch 90w points to the state S6. Furthermore, the surviving path to S6 now passes through S7 at t+3. Therefore, the circuit 44 loads the path history $V1_{t+3}$–$V0_{t+1}$ from Reg7 into the respective locations of Reg6. Likewise, the surviving path to S7 now passes through S1 at t+3, and thus the circuit 44 loads the path history $V1_{t+3}$–$V0_{t+1}$ from Reg1 into the respective locations of Reg7. Moreover, the surviving path to S1 passes through S0 at t+3, and thus the circuit 44 loads the path history $V1_{t+3}$–$V0_{t+1}$ from Reg0 into the respective locations of Reg1.

Figure 14A:
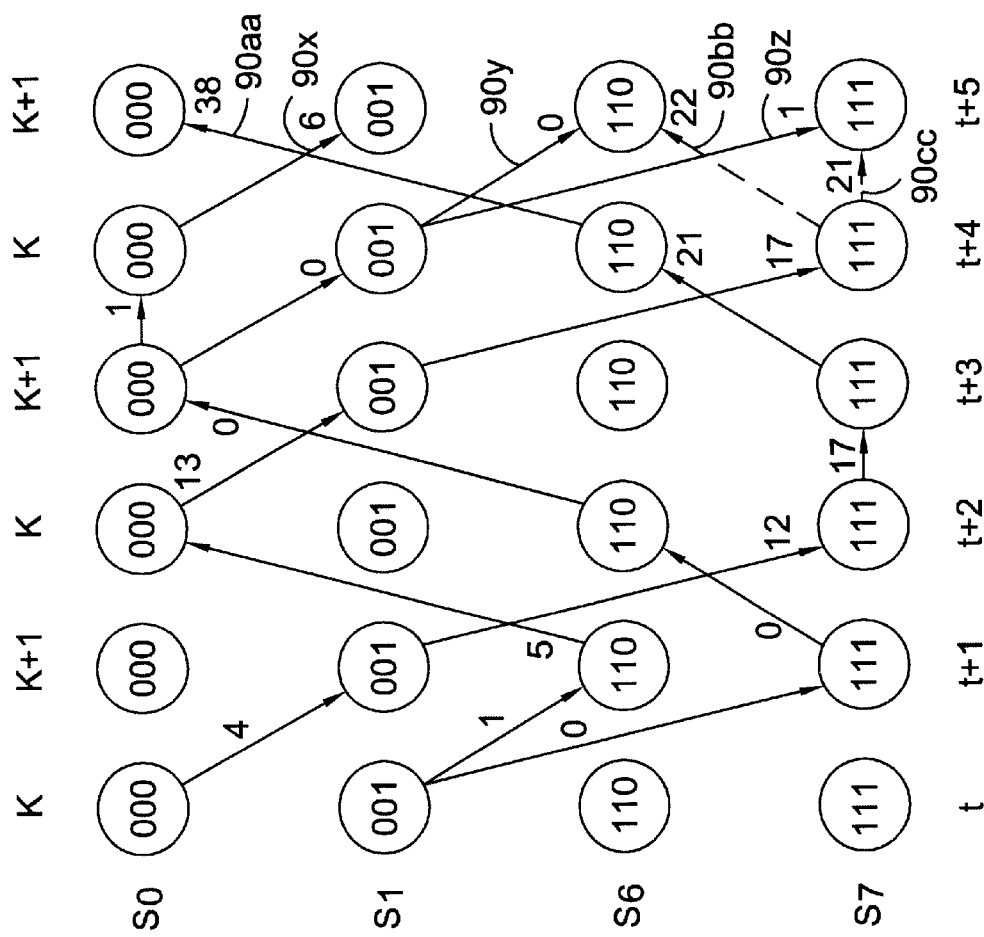
FIG. 14A is the trellis diagram of FIG. 13A at a subsequent sample time.

Referring to FIG. 14A, the recovery circuit 44 receives the next samples $B0_{IDEAL}$ and $B1_{IDEAL}$ corresponding to the sample time t+5. Referring to FIG. 7, the next two bits represented by the read signal at sample time t+5 are logic 1 and logic 0, which respectively correspond to the fourth and fifth separator bits between the inverted group 52 and the group 54 of the sync mark 50. Therefore, $B0_{IDEAL}$=1+1−0−0=+2, and $B1_{IDEAL}$=0+1−1−0=0. Using $B0_{IDEAL}$ and $B1_{IDEAL}$, the recovery circuit 44 calculates the branch metrics X and updates the path metrics for each of the respective branches 90 between the states S at t+4 and the states S at t+5. The updated path metrics label the respective branches.

Next, the recovery circuit 44 identifies the surviving path to each state at sample time t+5. The path connecting the actual states of the read bits, here the path that includes the branch 90y and into which all the surviving paths will eventually merge, has a path metric=0 in this ideal example.

Figure 14B:
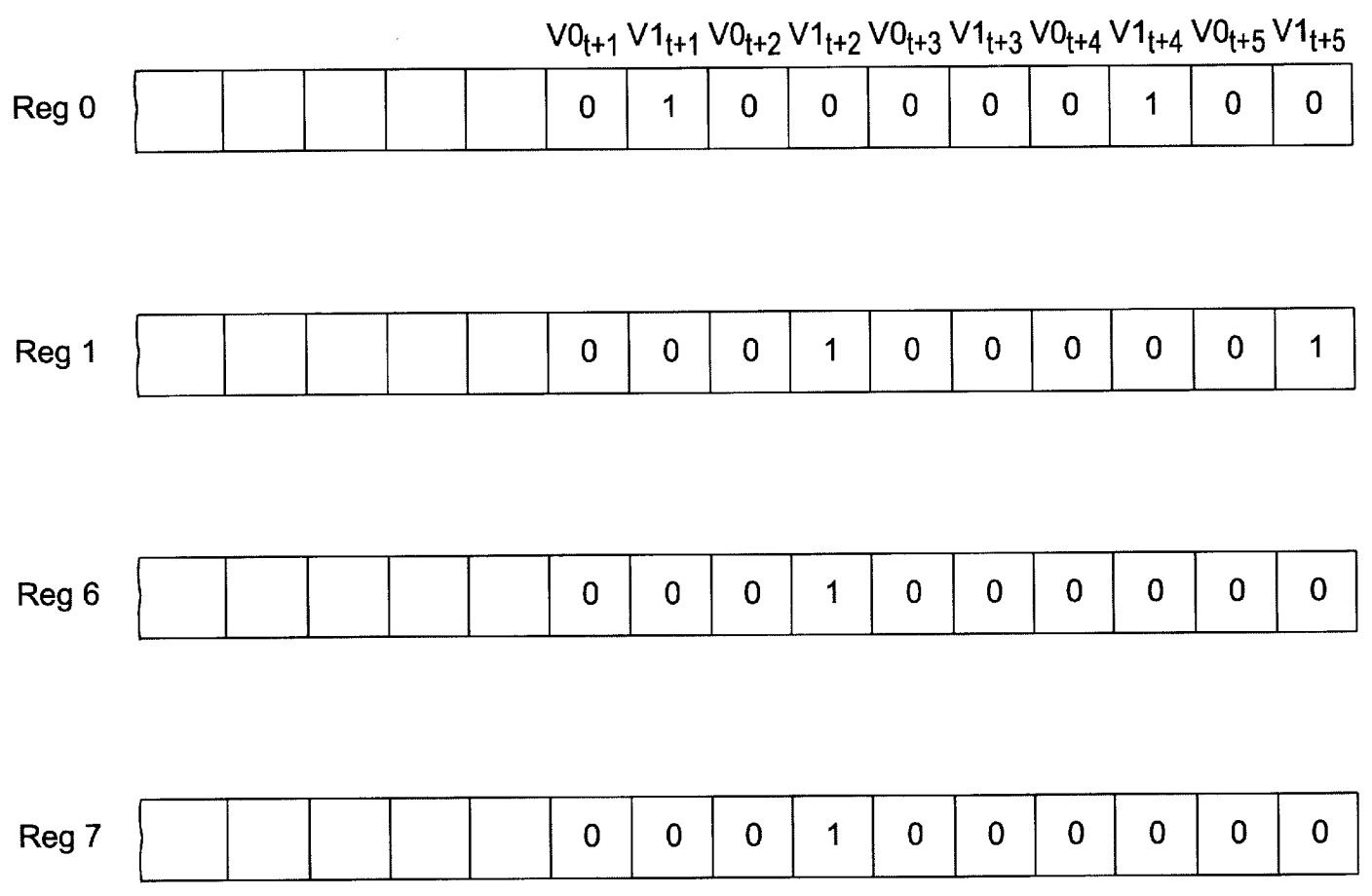

Referring to FIG. 14B, once the recovery circuit 44 identifies the surviving paths, it loads the corresponding sync-indicator values V0 and V1 into the respective shift registers Reg0, Reg1, Reg6, and Reg7. Referring to FIG. 14A, the recovery circuit 44 left shifts $V0_{t+5}$=$V1_{t+5}$=0 into Reg0, Reg6, and Reg7 because the normal-line surviving branches 90aa, 90y, and 90z respectively point to the states S0, S6, and S7. Conversely, the recovery circuit 44 left shifts $V0_{t+5}$=0 and $V1_{t+5}$=1 into Reg1 because the bold-line surviving branch 90x points to the state S1. Furthermore, the surviving paths to S6 and S7 now pass through S1 at t+4. Therefore, the circuit 44 loads the path history $V1_{t+4}$–$V0_{t+1}$ from Reg1 into the respective locations of Reg6 and Reg7. Likewise, the surviving path to S1 now passes through S0 at t+4, and thus the circuit 44 loads the path history $V1_{t+4}$–$V0_{t+1}$ from Reg0 into the respective locations of Reg1. Moreover, the surviving path to S0 now passes through S6 at t+4, and thus the circuit 44 loads the path history $V1_{t+4}$–$V0_{t+1}$ from Reg6 into the respective locations of Reg0.

Figure 15A:
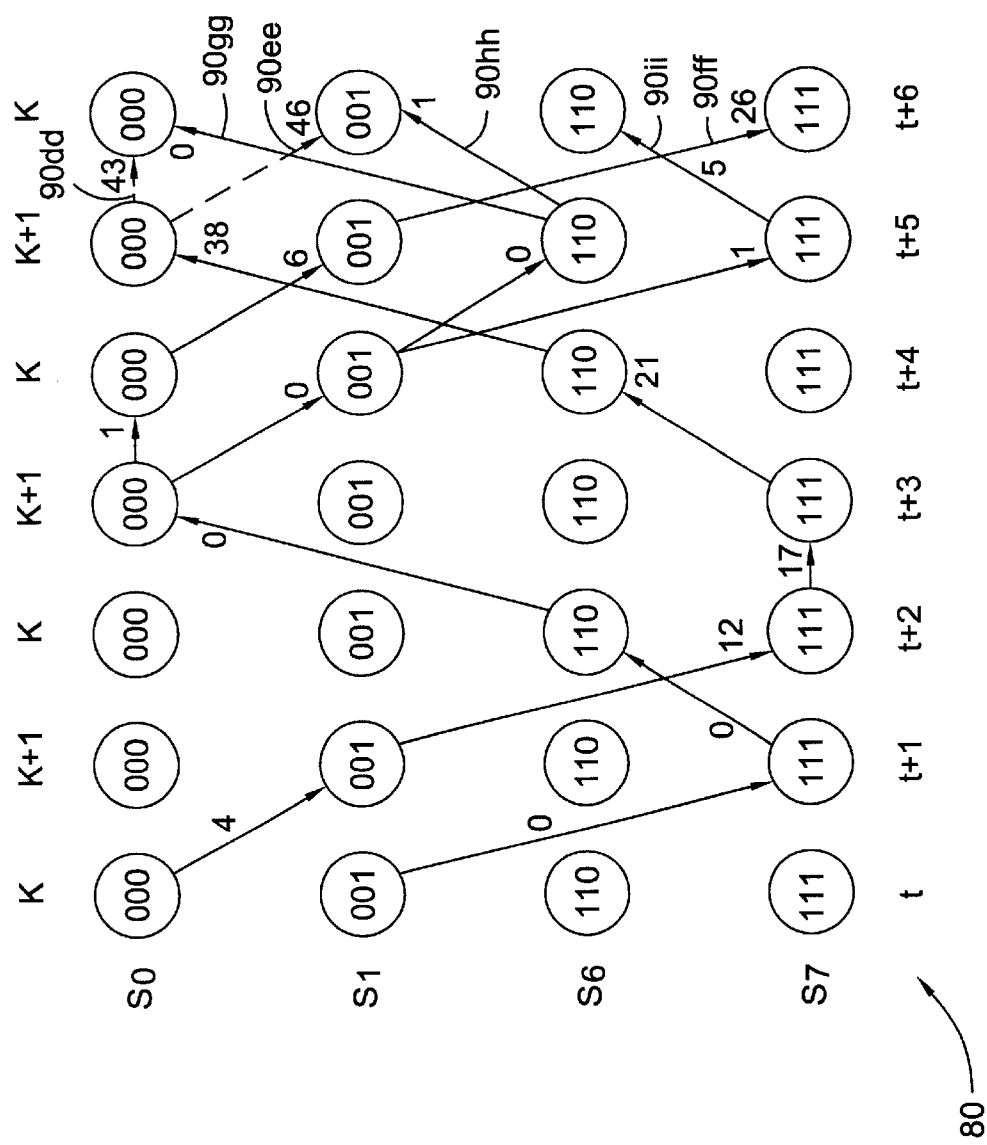
FIG. 15A is the trellis diagram of FIG. 14A at a subsequent sample time.

Referring to FIG. 15A, the recovery circuit 44 receives the next samples $B0_{IDEAL}$ and $B1_{IDEAL}$ corresponding to the sample time t+6. Referring to FIG. 7, the next two bits represented by the read signal at sample time t+6 are logic 0 and logic 0, which respectively correspond to the sixth separator bit between the groups 52 and 54 and the first bit of the group 54 of the sync mark 50. Therefore, $B0_{IDEAL}$=0+0−1−1=−2, and $B1_{IDEAL}$=0+0−0−1=−1. Using $B0_{IDEAL}$ and $B1_{IDEAL}$, the recovery circuit 44 calculates the branch metrics X and updates the path metrics for each of the respective branches 90 between the states S at t+5 and the states S at t+6. The updated path metrics label the respective branches.

Next, the recovery circuit 44 identifies the surviving path to each state at sample time t+6. The path connecting the actual states of the read bits, here the path that includes the branch 90gg and into which all the surviving paths will eventually merge, has a path metric=0 in this ideal example.

Figure 15B:
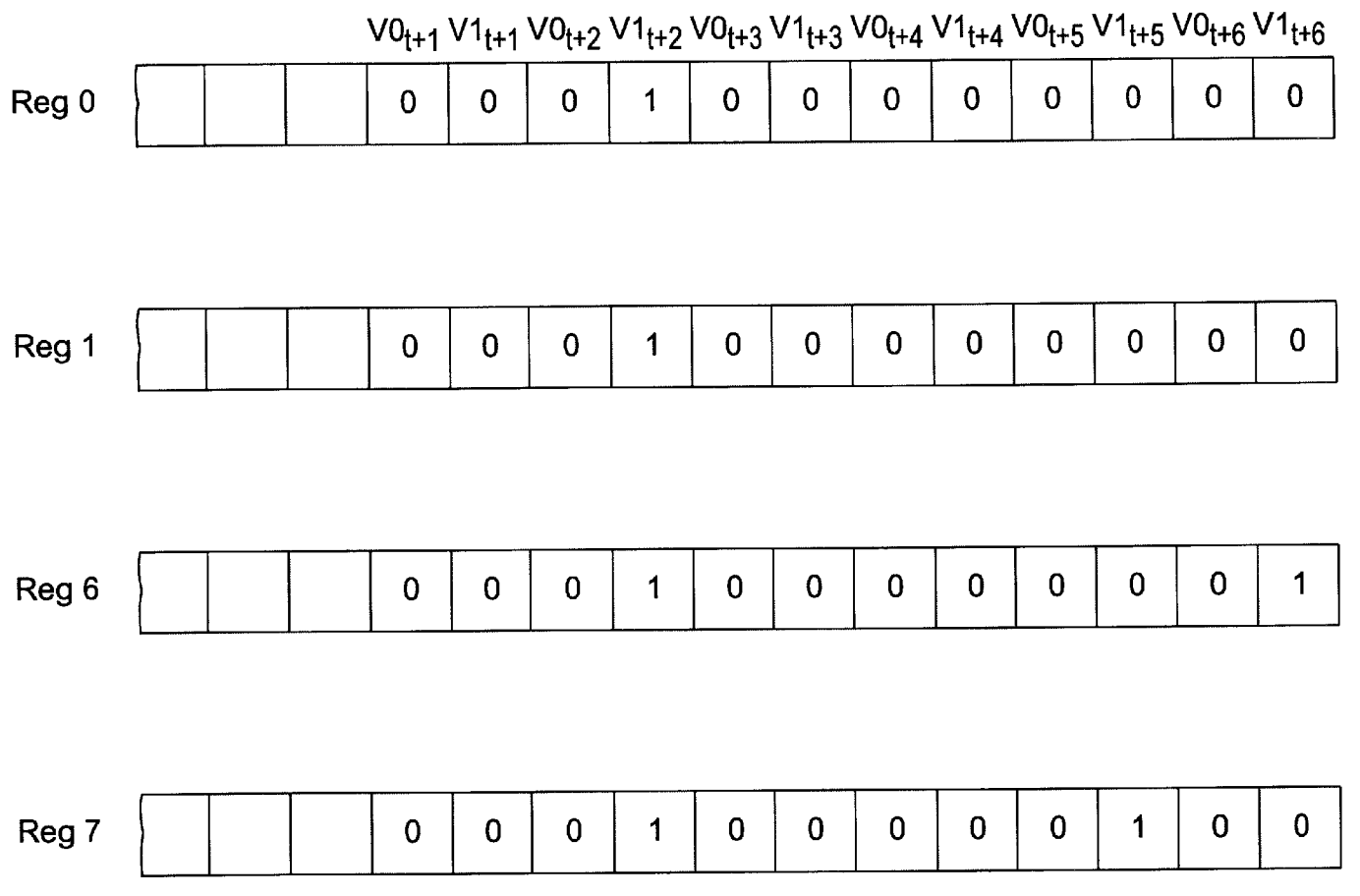

Referring to FIG. 15B, once the recovery circuit 44 identifies the surviving paths, it loads the corresponding sync-indicator values V0 and V1 into the respective shift registers Reg0, Reg1, Reg6, and Reg7. Referring to FIG. 15A, the recovery circuit 44 left shifts $V0_{t+6}$=$V1_{t+6}$=0 into Reg0, Reg1, and Reg7 because the normal-line surviving branches 90gg, 90hh, and 90ff respectively point to the states S0, S1, and S7. Conversely, the recovery circuit 44 left shifts $V0_{t+6}$=0 and $V1_{t+6}$=1 into Reg6 because the bold-line surviving branch 90ii points to the state S6. Furthermore, the surviving path to S6 now passes through S7 at t+5. Therefore, the circuit 44 loads the path history $V1_{t+5}$–$V0_{t+1}$ from Reg7 into the respective locations of Reg6. Likewise, the surviving path to S7 now passes through S1 at t+5, and thus the circuit 44 loads the path history $V1_{t+5}$–$V0_{t+1}$ from Reg1 into the respective locations of Reg7. Moreover, the surviving paths to S0 and S1 pass through S6 at t+6, and thus the circuit 44 loads the path history $V1_{t+5}$–$V0_{t+1}$ from Reg6 into the respective locations of Reg0 and Reg1.

Figure 16A:
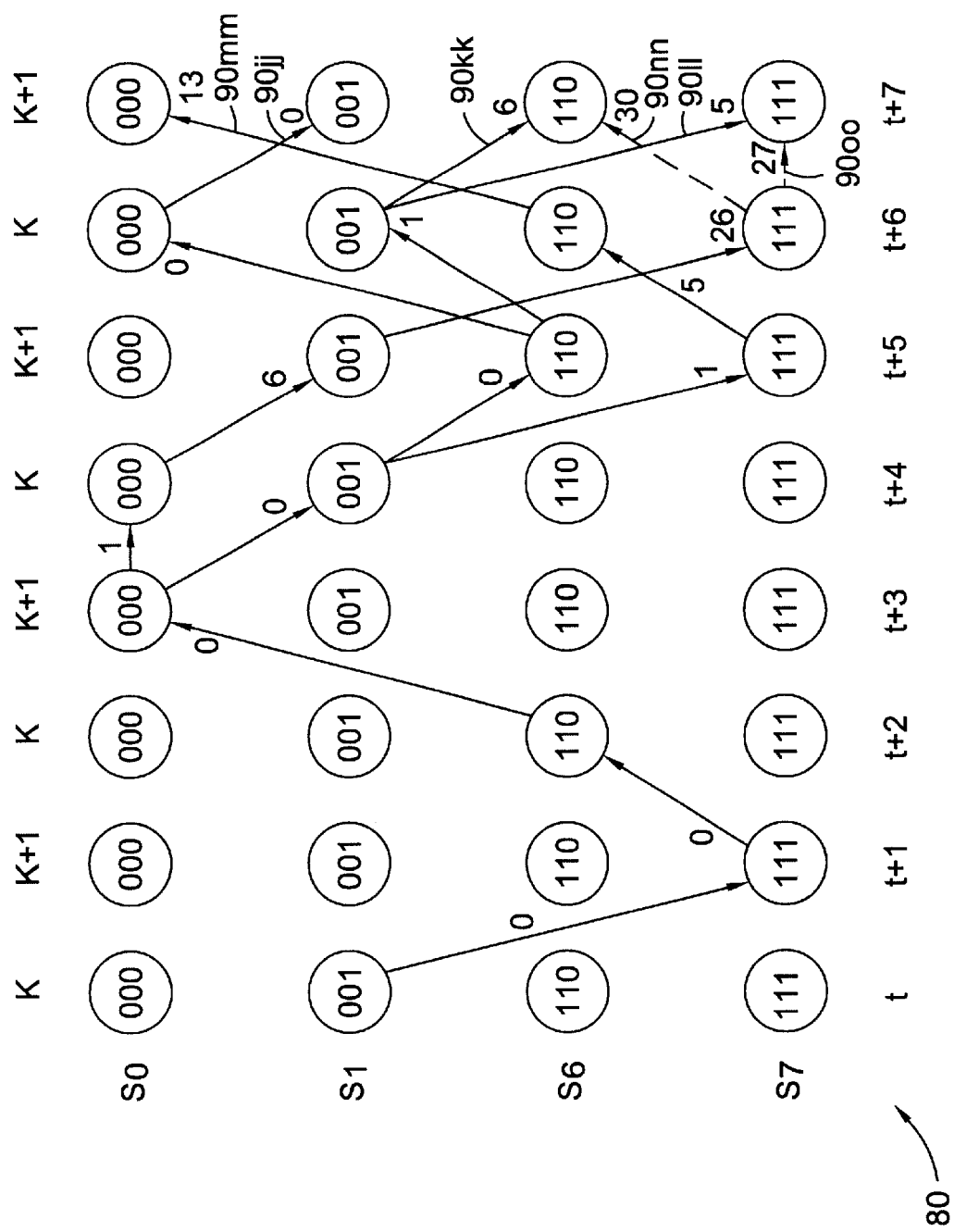
FIG. 16A is the trellis diagram of FIG. 15A at a subsequent sample time.

Referring to FIG. 16A, the recovery circuit 44 receives the next samples $B0_{IDEAL}$ and $B1_{IDEAL}$ corresponding to the sample time t+7. Referring to FIG. 7, the next two bits represented by the read signal at sample time t+7 are logic 0 and logic 1, which respectively are the second and third bits of group 54 of the sync mark 50. Therefore, $B0_{IDEAL}$=0+0−0−0=0, and $B1_{IDEAL}$=1+0−0−0=1. Using $B0_{IDEAL}$ and $B1_{IDEAL}$, the recovery circuit 44 calculates the branch metrics X and updates the path metrics for each of the respective branches 90 between the states S at t+6 and the states S at t+7. The updated path metrics label the respective branches.

Next, the recovery circuit 44 identifies the surviving path to each state at sample time t+7. The path connecting the actual states of the read bits, here the path that includes the branch 90jj and into which all the surviving paths will eventually merge, has a path metric=0 in this ideal example.

Figure 16B:
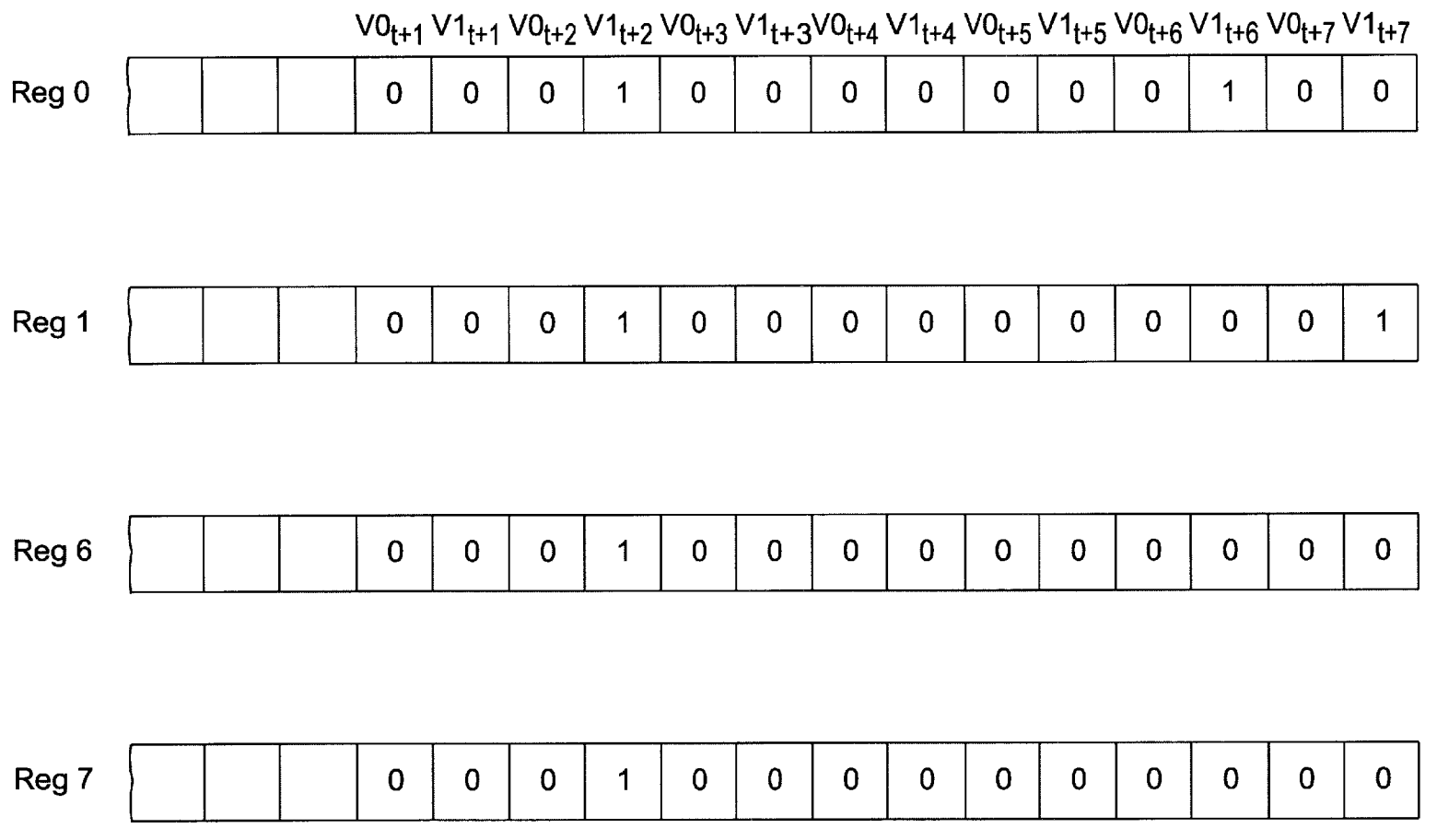

Referring to FIG. 16B, once the recovery circuit 44 identifies the surviving paths, it loads the corresponding sync-indicator values V0 and V1 into the respective shift registers Reg0, Reg1, Reg6, and Reg7. Referring to FIG. 16A, the recovery circuit 44 left shifts $V0_{t+5}$=$V1_{t+5}$=0 into Reg0, Reg6, and Reg7 because the normal-line surviving branches 90mm, 90kk, and 90ll respectively point to the states S0, S6, and S7. Conversely, the recovery circuit 44 left shifts $V0_{t+7}=0$ and $V1_{t+7}=1$ into Reg1 because the bold-line surviving branch 90*jj* points to the state S1. Furthermore, the surviving path to S0 now passes through S6 at t+6, and thus the circuit 44 loads the path history $V1_{t+6}$–$V0_{t+1}$ from Reg6 into the respective locations of Reg0. Likewise, the surviving path to S1 now passes through S0 at t+6, and thus the circuit 44 loads the path history $V1_{t+6}$–$V0_{t+1}$ from Reg0 into the respective locations of Reg1. Moreover, the surviving paths to S6 and S7 now pass through S1 at t+6. Therefore, the circuit 44 loads the path history $V1_{t+6}$–$V0_{t+1}$ from Reg1 into the respective locations of Reg6 and Reg7.

Referring to FIGS. 16A and 16B, an analysis of the expanded trellis 80 reveals that the surviving paths have merged into a single path—the path having an ideal path metric equal to 0—between t and t+3, and $V1_{t+2}$ has merged to a logic 1 in Reg0, Reg1, Reg6, and Reg7. As shown below, $V1_{t+2}$ is the first indicator bit 68 of the sync indicator of FIG. 7.

Figure 17A:
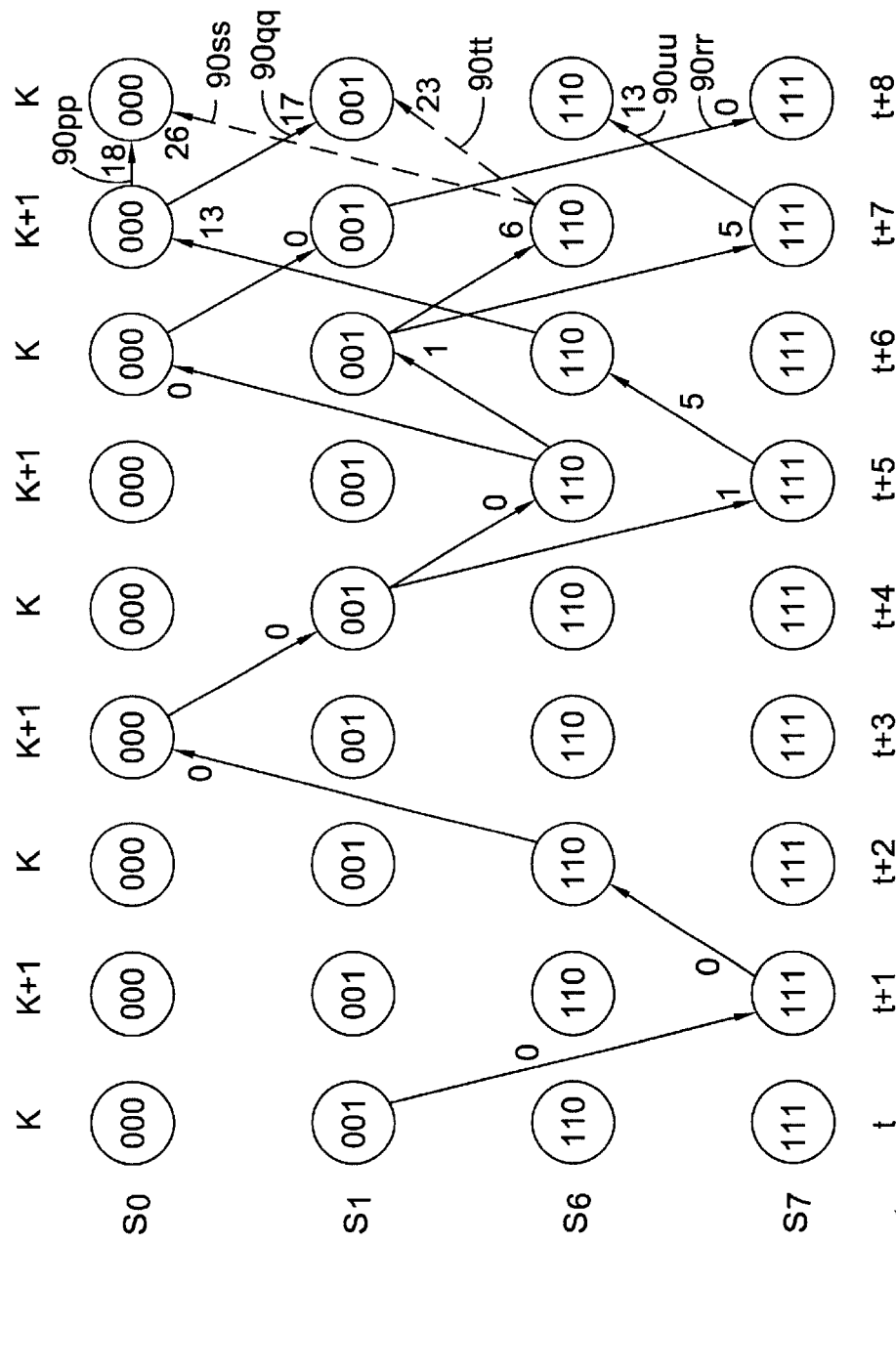
FIG. 17A is the trellis diagram of FIG. 16A at a subsequent sample time.

Referring to FIG. 17A, the recovery circuit 44 receives the next samples $B0_{IDEAL}$ and $B1_{IDEAL}$ corresponding to the sample time t+8. Referring to FIG. 7, the next two bits represented by the read signal at sample time t+8 are logic 1 and logic 1, which respectively correspond to the fourth bit of the group 54 and the first separator bit between the groups 55 and 56 of the sync mark 50. Therefore, $B0_{IDEAL}=1+1-0-0=+2$, and $B1_{IDEAL}=1+1-1-0=+1$. Using $B0_{IDEAL}$ and $B1_{IDEAL}$, the recovery circuit 44 calculates the branch metrics X and updates the path metrics for each of the respective branches 90 between the states S at t+7 and the states S at t+8. The updated path metrics label the respective branches.

Next, the recovery circuit 44 identifies the surviving path to each state at sample time t+8. The path connecting the actual states of the read bits, here the path that includes the branch 90*rr* and into which all the surviving paths will eventually merge, has a path metric=0 in this ideal example.

Referring to FIG. 17B, once the recovery circuit 44 identifies the surviving paths, it loads the corresponding sync-indicator values V0 and V1 into the respective shift registers Reg0, Reg1, Reg6, and Reg7. Referring to FIG. 17A, the recovery circuit 44 left shifts $V0_{t+8}=V1_{1+8}=0$ into Reg0, Reg1, and Reg7 because the normal-line surviving branches 90*pp*, 90*qq*, and 90*rr* respectively point to the states S0, S1, and S7. Conversely, the recovery circuit 44 left shifts $V0_{t+8}=0$ and $V1_{t+8}=1$ into Reg6 because the bold-line surviving branch 90*uu* points to the state S6. Furthermore, the surviving path to S1 now passes through S0 at t+7. Therefore, the circuit 44 loads the path history $V1_{t+7}$–$V0_{t+1}$ from Reg0 into the respective locations of Reg1. Likewise, the surviving path to S6 now passes through S7 at t+7, and thus the circuit 44 loads the path history $V1_{t+7}$–$V0_{t+1}$ from Reg7 into the respective locations of Reg6. Moreover, the surviving path to S7 passes through S1 at t+7, and thus the circuit 44 loads the path history $V1_{t+7}$–$V0_{t+1}$ from Reg1 into the respective locations of Reg7.

Referring to FIGS. 17A and 17B, an analysis of the expanded trellis 80 reveals that the surviving paths have merged into a single path—the path having an ideal path metric equal to 0—between t and t+4.

Figure 18A:
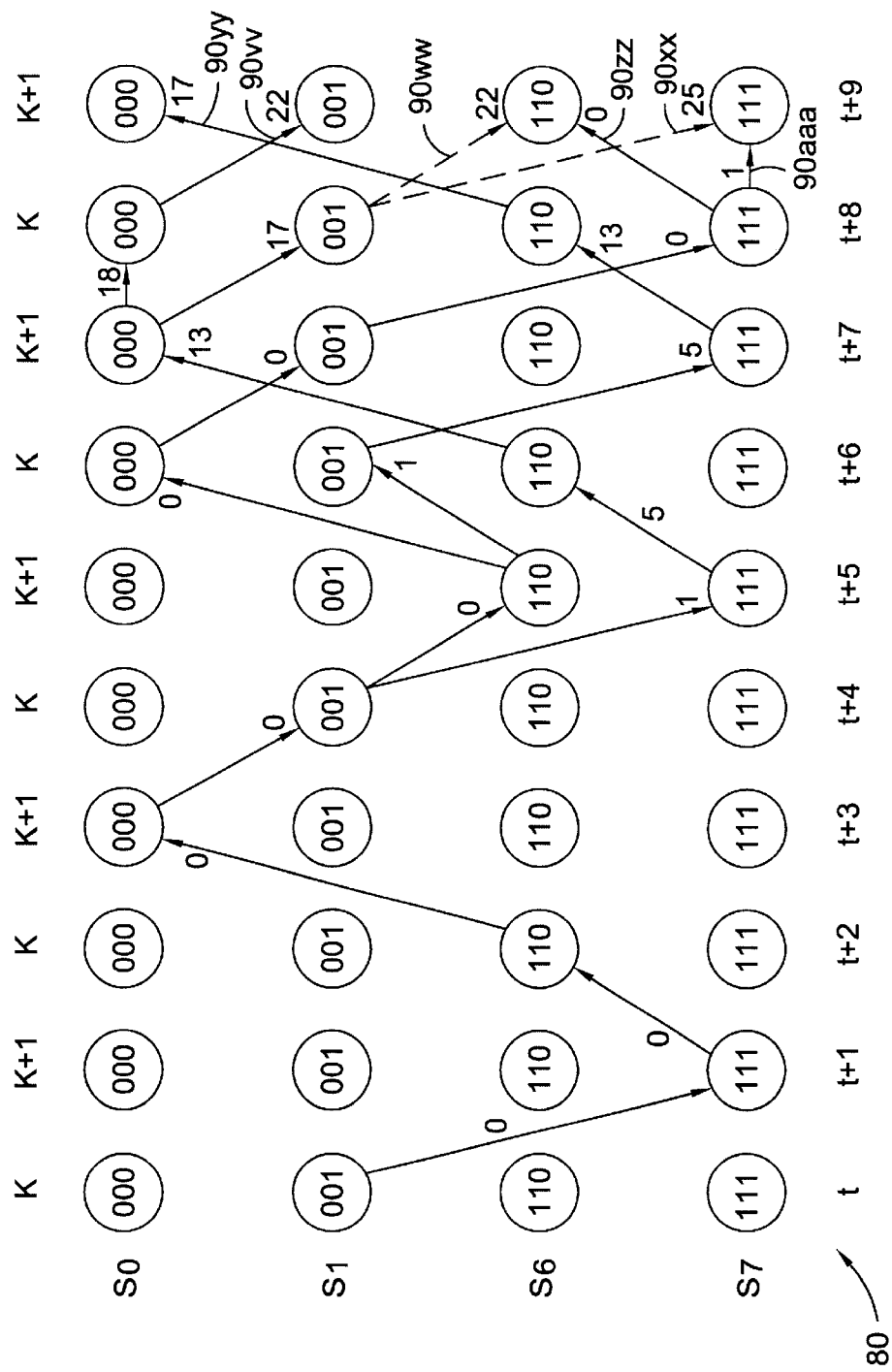
FIG. 18A is the trellis diagram of FIG. 17A at a subsequent sample time.

Referring to FIG. 18A, the recovery circuit 44 receives the next samples $B0_{IDEAL}$ and $B1_{IDEAL}$ corresponding to the sample time t+9. Referring to FIG. 7, the next two bits represented by the read signal at sample time t+9 are logic 1 and logic 0, which respectively are the second and third separator bits between the groups 54 and 56 of the sync mark 50. Therefore, $B0_{IDEAL}=1+1-1-1=0$, and $B1_{IDEAL}=0+1-1-1=-1$. Using $B0_{IDEAL}$ and $B1_{IDEAL}$, the recovery circuit 44 calculates the branch metrics X and updates the path metrics for each of the respective branches 90 between the states S at t+8 and the states S at t+9. The updated path metrics label the respective branches.

Next, the recovery circuit 44 identifies the surviving path to each state at sample time t+9. The path connecting the actual states of the read bits, here the path that includes the branch 90*zz* and into which all the surviving paths will eventually merge, has a path metric=0 in this ideal example.

Referring to FIG. 18B, once the recovery circuit 44 identifies the surviving paths, it loads the corresponding sync-indicator values V0 and V1 into the respective shift registers Reg0, Reg1, Reg6, and Reg7. Referring to FIG. 18A, the recovery circuit 44 left shifts $V0_{t+9}=V1_{t+9}=0$ into Reg0, Reg6, and Reg7 because the normal-line surviving branches 90*yy*, 90*zz*, and 90*aaa* respectively point to the states S0, S6, and S7. Conversely, the recovery circuit 44 left shifts $V0_{t+9}=0$ and $V1_{t+9}=1$ into Reg1 because the bold-line surviving branch 90*vv* points to the state S1. Furthermore, the surviving path to S0 now passes through S6 at t+8, and thus the circuit 44 loads the path history $V1_{t+8}$–$V0_{t+1}$ from Reg6 into the respective locations of Reg0. Likewise, the surviving path to S1 now passes through S0 at t+8, and thus the circuit 44 loads the path history $V1_{t+8}$–$V0_{t+1}$ from Reg0 into the respective locations of Reg1. Moreover, the surviving path to S6 now passes through S7 at t+8, and thus the circuit 44 loads the path history $V1_{t+8}$–$V0_{t+1}$ from Reg7 into the respective locations of Reg6.

Figure 19A:
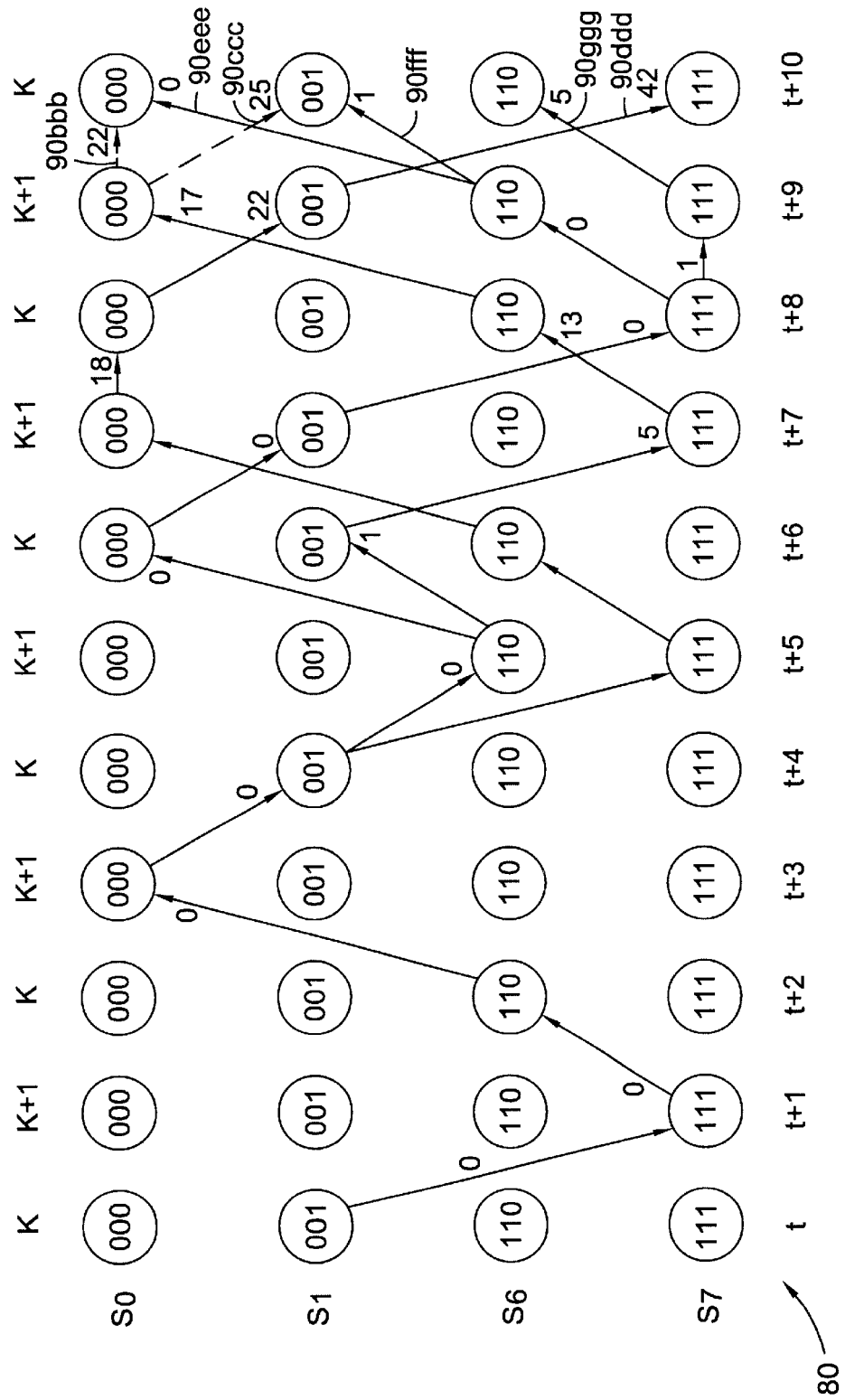
FIG. 19A is the trellis diagram of FIG. 18A at a subsequent sample time.

Referring to FIG. 19A, the recovery circuit 44 receives the next samples $B0_{IDEAL}$ and $B1_{IDEAL}$ corresponding to the sample time t+10. Referring to FIG. 7, the next two bits represented by the read signal at sample time t+10 are logic 0 and logic 0, which respectively correspond to the fourth separator bit between the groups 54 and 56 of the sync mark 50 and the first bit of the group 56. Therefore, $B0_{IDEAL}=0+0-1-1=-2$, and $B1_{IDEAL}=0+0-0-1=-1$. Using $B0_{IDEAL}$ and $B1_{IDEAL}$, the recovery circuit 44 calculates the branch metrics X and updates the path metrics for each of the respective branches 90 between the states S at t+9 and the states S at t+10. The updated path metrics label the respective branches.

Next, the recovery circuit 44 identifies the surviving path to each state at sample time t+10. The path connecting the actual states of the read bits, here the path that includes the branch 90*eee* and into which all the surviving paths will eventually merge, has a path metric=0 in this ideal example.

Figure 19B:
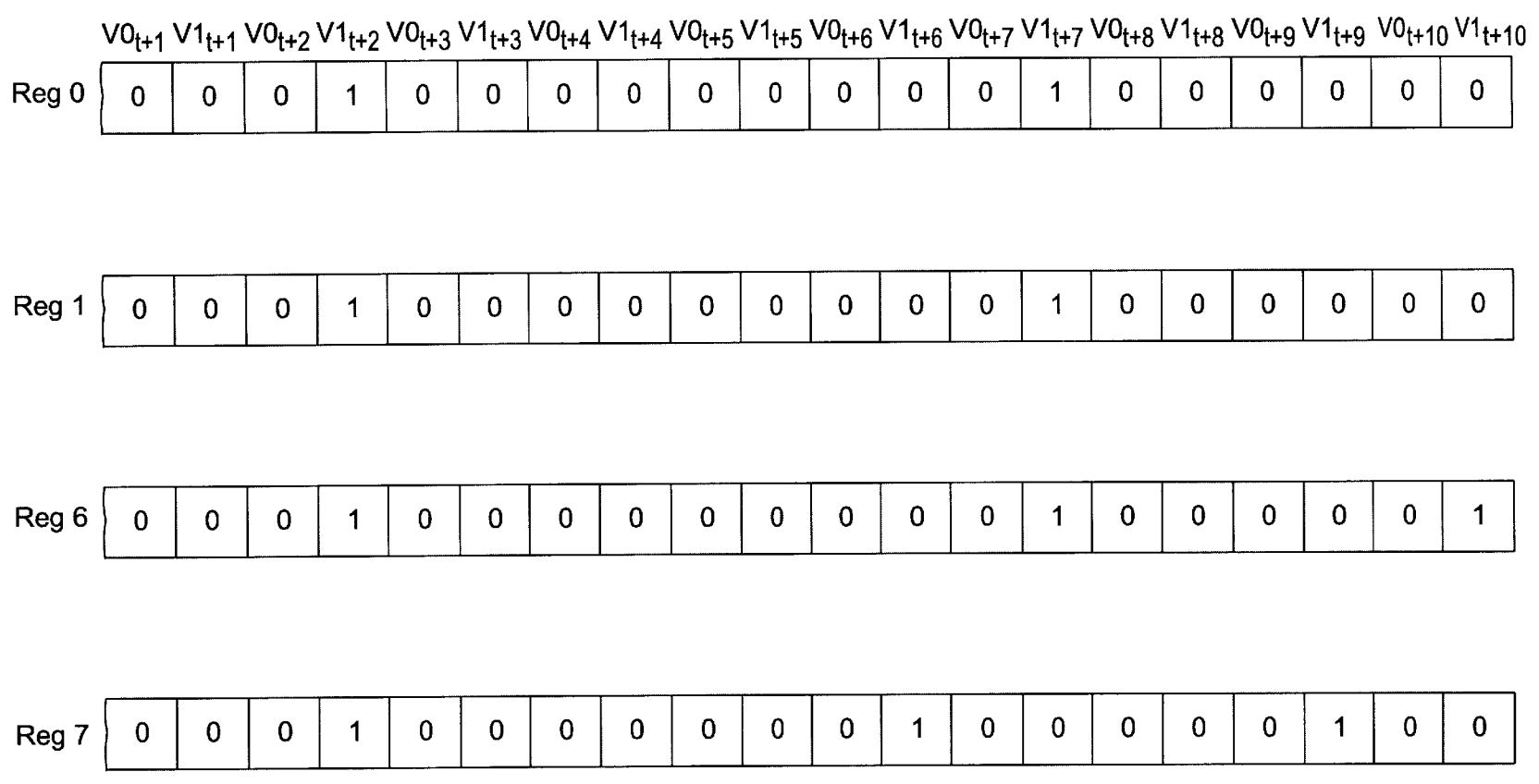

Referring to FIG. 19B, once the recovery circuit 44 identifies the surviving paths, it loads the corresponding sync-indicator values V0 and V1 into the respective shift registers Reg0, Reg1, Reg6, and Reg7. Referring to FIG. 19A, the recovery circuit 44 left shifts $V0_{t+10}=V1_{t+10}=0$ into Reg0, Reg1, and Reg7 because the normal-line surviving branches 90*eee*, 90*fff*, and 90*ddd* respectively point to the states S0, S1, and S7. Conversely, the recovery circuit 44 left shifts $V0_{t+10}=0$ and $V1_{t+10}=1$ into Reg6 because the bold-line surviving branch 90*ggg* points to the state S6. Furthermore, the surviving paths to S0 and S1 now pass through S6 at t+9. Therefore, the circuit 44 loads the path history $V1_{t+9}$–$V0_{t+1}$ from Reg6 into the respective locations of Reg0 and Reg1. Likewise, the surviving path to S6 now passes through S7 at t+9, and thus the circuit 44 loads the path history $V1_{t+9}$–$V0_{t+1}$ from Reg7 into the respective locations of Reg6. Moreover, the surviving path to S7 passes through S1 at t+9, and thus the circuit 44 loads the path history $V1_{t+9}$–$V0_{t+1}$ from Reg1 into the respective locations of Reg7.

Figure 20A:
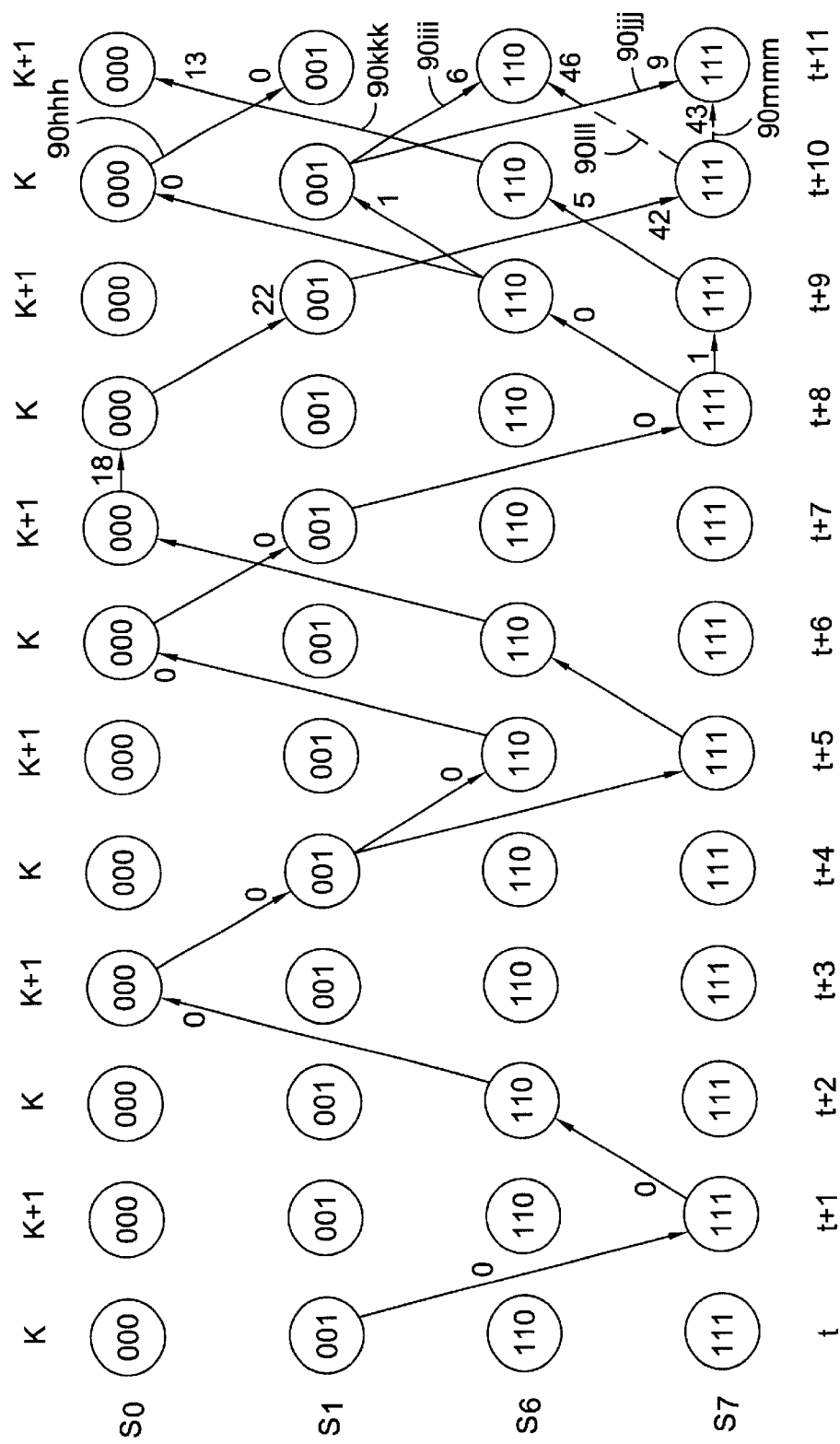
FIG. 20A is the trellis diagram of FIG. 19A at a subsequent sample time.

Referring to FIG. 20A, the recovery circuit 44 receives the next samples $B0_{IDEAL}$ and $B1_{IDEAL}$ corresponding to the sample time t+11. Referring to FIG. 7, the next two bits represented by the read signal at sample time t+11 are logic 0 and logic 10, which respectively are the second and third bits of the group 56 of the sync mark 50. Therefore, $B0_{IDEAL}=0+0-0-0=0$, and $B1_{IDEAL}=1+0-0-0=+1$. Using $B0_{IDEAL}$ and $B1_{IDEAL}$, the recovery circuit 44 calculates the branch metrics X and updates the path metrics for each of the respective branches 90 between the states S at t+10 and the states S at t+11. The updated path metrics label the respective branches.

Next, the recovery circuit 44 identifies the surviving path to each state at sample time t+11. The path connecting the actual states of the read bits, here the path that includes the branch 90hhh and into which all the surviving paths will eventually merge, has a path metric=0 in this ideal example.

Referring to FIG. 20B, once the recovery circuit 44 identifies the surviving paths, it loads the corresponding sync-indicator values V0 and V1 into the respective shift registers Reg0, Reg1, Reg6, and Reg7. Referring to FIG. 20A, the recovery circuit 44 left shifts $V0_{t+11}=V1_{t+11}=0$ into Reg0, Reg6, and Reg7 because the normal-line surviving branches 90kkk, 90iii, and 90jjj respectively point to the states S0, S6, and S7. Conversely, the recovery circuit 44 left shifts $V0_{t+11}=0$ and $V1_{t+11}=1$ into Reg1 because the bold-line surviving branch 90hhh points to the state S1. Furthermore, the surviving path to S0 now passes through S6 at t+10, and thus the circuit 44 loads the path history $V1_{t+10}-V0_{t+1}$ from Reg6 into the respective locations of Reg0. Likewise, the surviving path to S1 now passes through S0 at t+10, and thus the circuit 44 loads the path history $V1_{t+10}-V0_{t+1}$ from Reg0 into the respective locations of Reg1. Moreover, the surviving paths to S6 and S7 now pass through S1 at t+10, and thus the circuit 44 loads the path history $V1_{t+10}-V0_{t+1}$ from Reg1 into the respective locations of Reg6 and Reg7.

Figure 21:
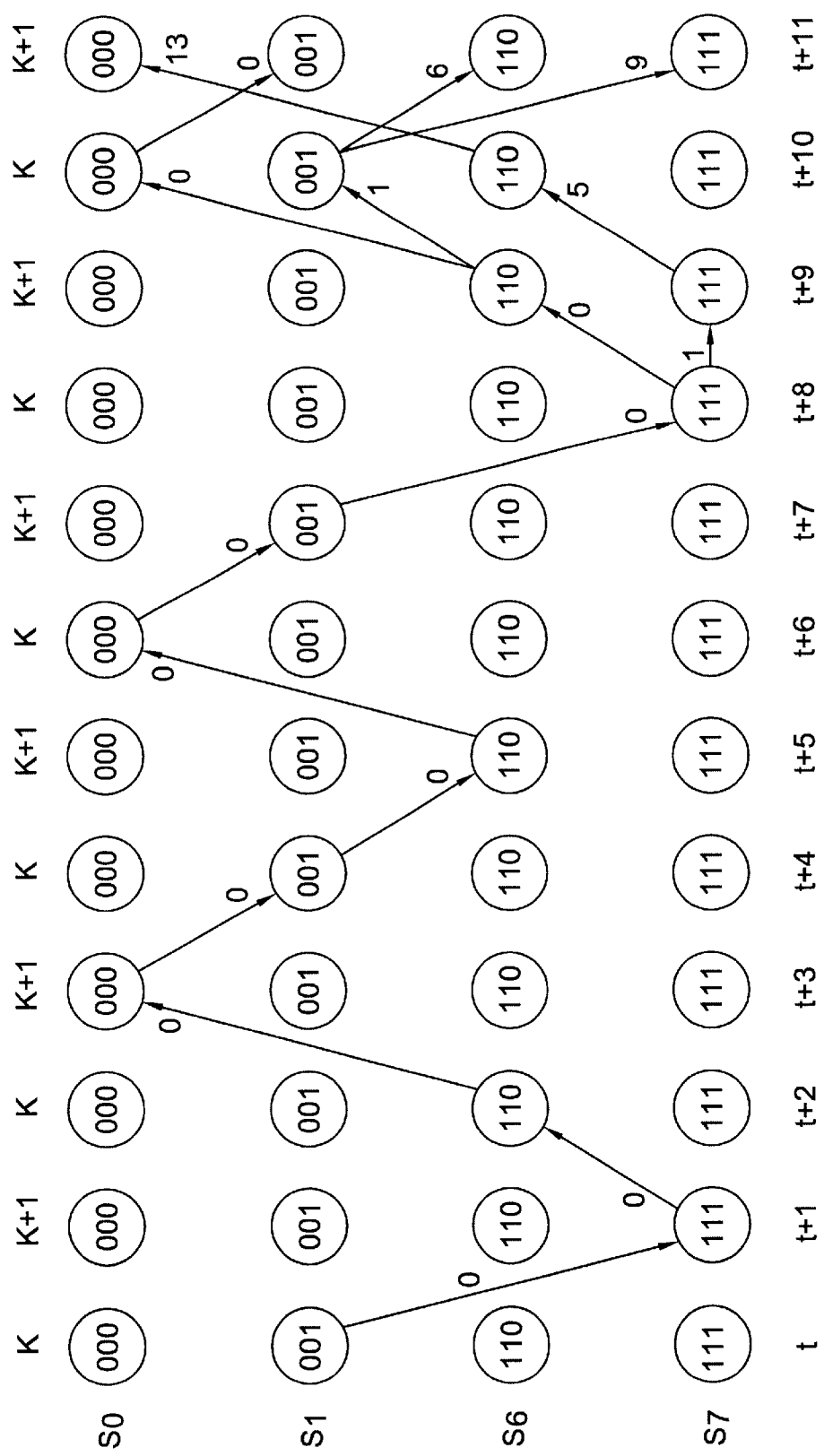
FIG. 21 is the trellis diagram of FIG. 20A showing the surviving paths only.

FIG. 21 is the expanded trellis 80 of FIG. 20A with all of the eliminated paths removed. At t+11, the surviving paths have merged into a single surviving path—the path having the ideal path metric equal to 0—between t and t+8.

An analysis of the FIGS 10A–21 reveals that the synchronizer circuit 36 of FIG. 6 allows the pad 76 to be shorter than the metric needed to accommodate the latency of the recovery circuit 44. Referring to FIGS. 14B and 15B, the recovery circuit 44 has a latency of ten bits, i.e., five clock cycles. That is, the recovery circuit 44 left shifts ten bits into each of the registers Reg0, Reg1, Reg6, and Reg7 before $V1_{t+2}$ converges to the logic 1 indicator bit 68 in all of these registers. But referring to FIG. 14B, $V1_{t+2}$ converges to the logic 1 indicator bit 68 in three of these registers, here Reg1, Reg6, and Reg7, in only eight bits, i.e., four clock cycles. Likewise, referring to FIG. 19B, $V1_{t+7}$ converges to the logic 1 indicator bit 70 in three registers Reg0, Reg1, and Reg7 in only four clock cycles. In fact, one finds that the remaining indicator bits 72 and 74 converge to logic 1 in three registers within four clock cycles. The inventors have further discovered that convergence of an indicator. bit occurs in Reg1 or Reg6—depending on whether S1 or S6, respectively, is the current state of the preamble—within four clock cycles. That is, referring to FIGS. 8 and 9, the state transitions of the sync circuit 36 are aligned with the preamble such that at sample times k the preamble has the state S1 and at times k+1 the preamble has the state S6. Because of this alignment and because the sync mark 50 is merely a partially inverted version of the preamble, the path history stored in Reg1 at times k is accurate beyond the most recent six bits. Likewise, the path history stored in Reg6 at times k+1 is accurate beyond the most recent six bits. Therefore, by analyzing the path history from Reg1 at times k and analyzing the path history from Reg6 at times k+1, one can reduce the length of the pad 76 from eight bits (length required to accommodate the ten-bit latency of the recovery circuit 44) to six bits. A six-bit pad 76 is long enough to allow at least the path history within Reg6 to properly converge to the last indicator bit 74. Thus, this shortening of the pad 76 allows room for two additional data bits in the respective data sector. Because a magnetic disk may have thousands of data sectors, this significantly increases the data-storage capacity of the disk.

Figure 22:
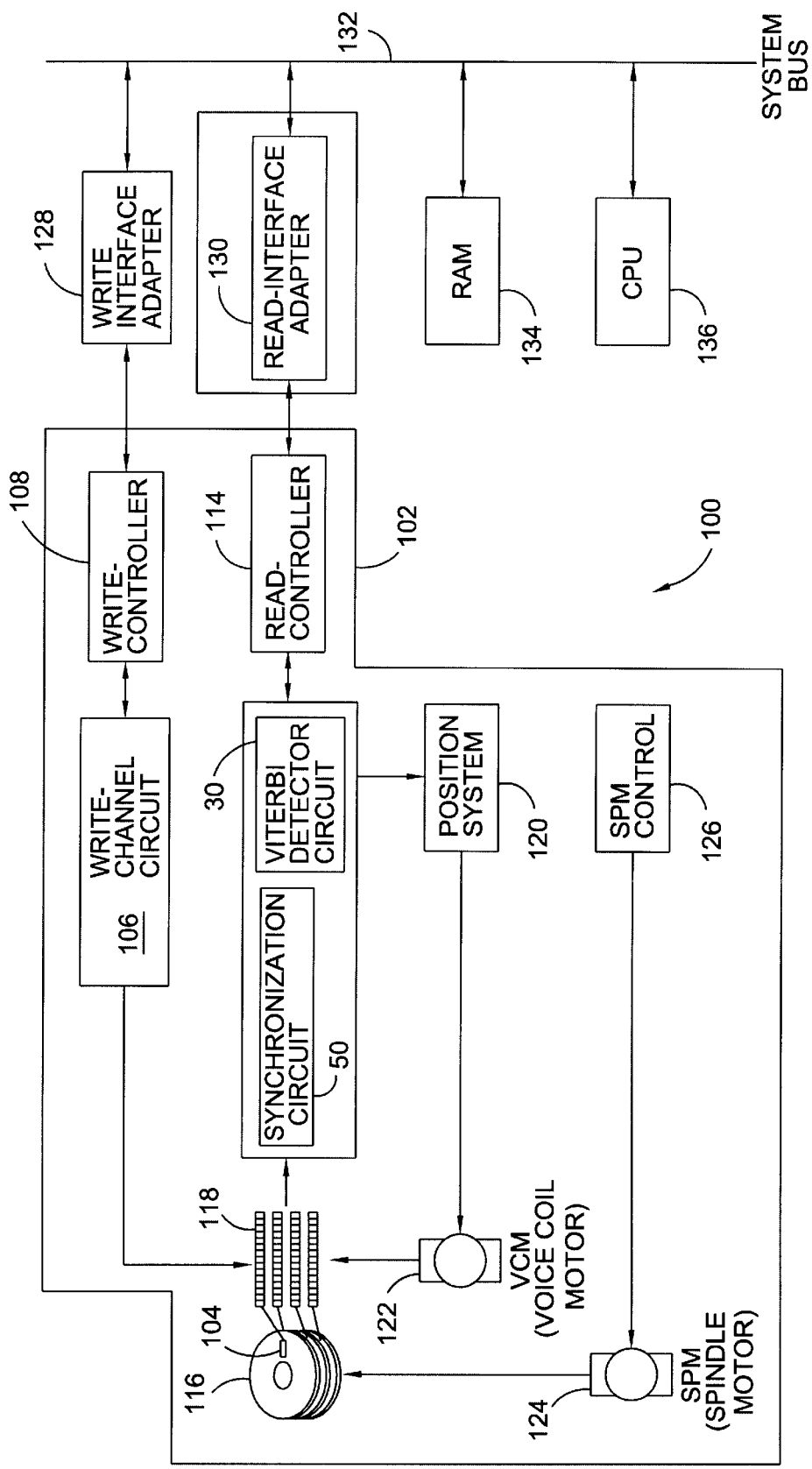
FIG. 22 is a block diagram of a disk-drive system that incorporates the sync circuit of FIG. 4 according to an embodiment of the invention.

FIG. 22 is a block diagram of a disk-drive system 100 according to an embodiment of the invention. Specifically, the disk-drive system 100 includes a disk drive 102, which incorporates the read channel 30 of FIG. 3. The disk drive 102 includes a combination write/read head 104, a write-channel circuit 106 for generating and driving the head 104 with a write signal, and a write controller 108 for interfacing the write data to the write-channel circuit 106. In one embodiment, the write-channel circuit 106 includes the data encoder disclosed in heretofore incorporated U.S. patent application Ser. No. 09/410,276. The disk drive 102 also includes the read channel 30 for receiving a read signal from the head 104 and for recovering the written data from the read signal, and includes a read controller 114 for organizing the read data. The disk drive 102 further includes a storage medium such as one or more disks 116, each of which may contain data on one or both sides. The write/read head 104 writes/reads the data stored on the disks 116 and is connected to a movable support arm 118. A position system 120 provides a control signal to a voice-coil motor (VCM) 122, which positionally maintains/moves the arm 118 so as to positionally maintain/radially move the head 104 over the desired data on the disks 116. A spindle motor (SPM) 124 and a SPM control circuit 126 respectively rotate the disks 116 and maintain them at the proper rotational speed.

The disk-drive system 100 also includes write and read interface adapters 128 and 130 for respectively interfacing the write and read controllers 108 and 114 to a system bus 132, which is specific to the system used. Typical system busses include ISA, PCI, S-Bus, Nu-Bus, etc. The system 100 also typically has other devices, such as a random access memory (RAM) 134 and a central processing unit (CPU) 136 coupled to the bus 132.

From the foregoing it will be appreciated that, although specific embodiments of the invention have been described herein for purposes of illustration, various modifications may be made without deviating from the spirit and scope of the invention. Furthermore, because one of skill in the art can design circuitry or software to perform the above-described functions, the details of this circuitry and software are omitted for clarity.

We claim:

1. A synchronizer circuit, comprising:
   an input terminal operable to receive an input signal that includes a preamble and a synchronization mark;
   an output terminal; and
   a recovery circuit coupled to the input and output terminals and operable to,
      recover the synchronization mark from the input signal by sequentially executing respective state-transition routines of a Viterbi algorithm in a predetermined alignment with the preamble, and
      generate a synchronization signal on the output terminal in response to the recovered synchronization mark.

2. The synchronizer circuit of claim 1 wherein the Viterbi algorithm comprises a time-varying Viterbi algorithm.

3. The synchronizer circuit of claim 1 wherein the state-transition routines of the Viterbi algorithm comprise:
   a first state-transition routine; and
   a second state-transition routine that is different than the first state-transition routine.

4. The synchronizer circuit of claim 1 wherein the recovery circuit is further operable to determine the alignment between the executing of the state-transition routines and the preamble.

5. The synchronizer circuit of claim 1 wherein the recovery circuit is further operable to align the executing of the state-transition routines with the preamble in the predetermined alignment.

6. The synchronizer circuit of claim 1, further comprising:
   a control terminal operable to receive a control signal; and
   wherein the recovery circuit is further operable to align the executing of the state-transition routines with the preamble in response to the control signal.

7. The synchronizer circuit of claim 1 wherein the recovery circuit is further operable to determine the alignment between the executing of the state-transition routines and the preamble, and, if the alignment is not the predetermined alignment, then align the executing of the state-transition routines with the preamble in the predetermined alignment.

8. The synchronizer circuit of claim 1, further comprising:
   a control terminal operable to receive a control signal; and
   wherein response to the control signal, the recovery circuit is further operable to generate the synchronization signal in response to a recovered portion of the synchronization mark.

9. The synchronizer circuit of claim 1, further comprising:
   a control terminal operable to receive a control signal; and
   wherein response to the control signal, the recovery circuit is further operable to generate the synchronization signal only if the recovery circuit recovers an aligned portion of the synchronization mark within a predetermined time after the recovery circuit recovers an unaligned portion of the synchronization mark.

10. The synchronizer circuit of claim 1 wherein the recovery circuit is further operable to:
    recover the synchronization mark by generating a synchronization indicator in response to the synchronization mark; and
    generate the synchronization signal in response to the synchronization indicator.

11. The synchronizer circuit of claim 1, further comprising:
    a register; and
    wherein the recovery circuit is further operable to,
      recover the synchronization mark by generating a synchronization indicator in response to the synchronization mark;
      load the synchronization indicator into the register; and
      generate the synchronization signal in response to the loaded synchronization indicator.

12. A circuit, comprising:
    an input terminal operable to receive an input signal that includes a synchronization mark;
    an output terminal; and
    a tracking circuit coupled to the input and output terminals and operable to,
      generate a synchronization indicator from the input signal in response to the synchronization mark, the synchronization indicator being different than the input signal and the synchronization mark, and
      generate a synchronization signal in response to the synchronization indicator.

13. The circuit of claim 12 wherein the synchronization indicator includes first groups of synchronization-indicator bits, each of the first groups corresponding to a respective second group of bits that compose the synchronization mark, each of the first groups having fewer bits than the corresponding second group.

14. The circuit of claim 12 wherein:
    the synchronization indicator includes synchronization-indicator bits; and
    each synchronization-indicator bit of the synchronization indicator corresponds to a respective group of four bits of the synchronization mark.

15. A read channel, comprising:
    an input terminal operable to receive an read signal that includes a synchronization mark and data;
    a synchronization circuit coupled to the input terminal, having a synchronization output terminal, and operable to,
      recover the synchronization mark from the read signal by executing a first Viterbi algorithm, and
    generate a synchronization signal on the synchronization output terminal in response to the recovered synchronization mark; and
    a Viterbi detector coupled to the input terminal and to the synchronization output terminal and operable to recover the data from the read signal in response to the synchronization signal by executing a second Viterbi algorithm.

16. The read channel of claim 15 wherein:
    the synchronization circuit is operable to transition the synchronization signal from a first to a second signal level; and
    the Viterbi detector is operable to begin recovering the data in response to the transition of the synchronization signal.

17. A disk-drive system, comprising:
    a data-storage disk having a surface and operable to store data values;
    a motor coupled to and operable to rotate the disk;
    a read head operable to generate a read signal that includes a data forerunner and data;
    a read-head positioning assembly operable to move the read head over the surface of the disk;
    a synchronization circuit coupled to the read head and operable to,
      recover a synchronization mark from the data forerunner by executing a first Viterbi algorithm, and
    generate a synchronization signal in response to the synchronization mark; and
    a Viterbi detector coupled to the read head and to the synchronization circuit and operable to recover the data from the read signal in response to the synchronization signal by executing a second Viterbi algorithm.

18. A method, comprising:
    recovering a synchronization mark from a data signal by sequentially executing respective state-transition routines of a Viterbi algorithm in a predetermined alignment with the data signal; and
    generating a synchronization signal in response to the recovering of the synchronization mark.

19. The method of claim 18 wherein the recovering comprises tracking a sequence of values represented by the data signal.

20. The method of claim 18 wherein the recovering comprises:
- tracking a sequence of values represented by the data signal; and
- generating a synchronization indicator in response to the tracked sequence.

21. The method of claim 18, further comprising aligning the state-transition routines to the data signal before recovering the synchronization mark.

22. The method of claim 18, further comprising determining an alignment between the state-transition routines and the data signal.

23. The method of claim 18, further comprising:
- determining an alignment between the state-transition routines and the data signal; and
- realigning the transition routines with the data signal in the predetermined alignment if the determined alignment is not the predetermined alignment.

24. The method of claim 18, wherein:
- the recovering comprises recovering a portion of the synchronization mark; and
- the generating comprises generating the synchronization signal in response to the recovered portion of the synchronization mark.

25. The method of claim 18 wherein the generating comprises generating the synchronization signal only if the recovery circuit recovers a portion of the synchronization mark within a predetermined time.

26. A method, comprising:
- tracking an input signal that includes a synchronization mark;
- recovering from the input signal a synchronization indicator that corresponds to the synchronization mark, the synchronization indicator being different than the input signal and the synchronization mark; and
- generating a synchronization signal in response to the synchronization indicator.

27. The method of claim 26 wherein the recovering comprises recovering the synchronization indicator by executing a Viterbi algorithm.

28. The method of claim 26, further comprising loading the synchronization indicator into a path-history register.

29. A method, comprising:
- recovering a synchronization mark from a data signal with a first Viterbi detector;
- generating a synchronization signal in response to the recovered synchronization mark; and
- recovering data from the data signal with a second Viterbi detector in response to the synchronization signal.

30. The method of claim 29 wherein:
- the generating comprises,
  - generating the synchronization signal having a first signal level, and
  - transitioning the synchronization signal from the first to a second signal level in response to recovering the synchronization mark; and
- the recovering the data comprises initiating recovery of the data in response to the transitioning of the synchronization signal.

31. A method, comprising:
- tracking an input signal that includes a synchronization mark;
- executing a Viterbi algorithm to recover from the input signal a synchronization indicator that corresponds to the synchronization mark, the synchronization indicator being different than the input signal and the synchronization mark; and
- loading the synchronization indicator into a path-history register.

* * * * *

UNITED STATES PATENT AND TRADEMARK OFFICE
CERTIFICATE OF CORRECTION

Figure 1:
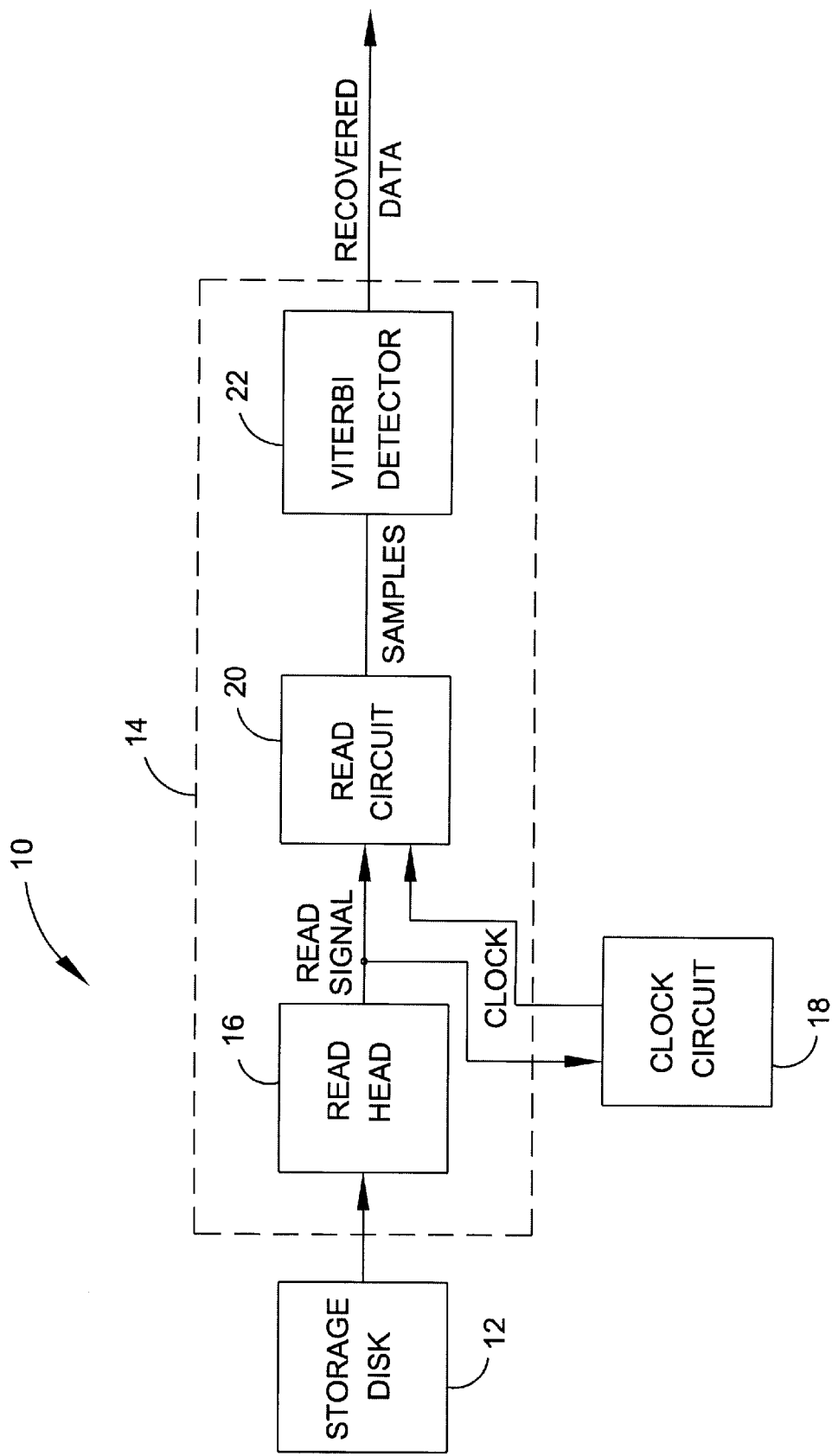
FIG. 1 is a partial block diagram of a disk-drive that includes a storage disk and a read channel according to the prior art.

PATENT NO.  : 6,604,204 B1  
DATED       : August 5, 2003  
INVENTOR(S) : Hakan Ozdemir and Francesco Rezzi It is certified that error appears in the above-identified patent and that said Letters Patent is hereby corrected as shown below:

Drawings,
FIG. 1, the dash line block that says "114" should actually be -- 14 --.

Column 21,
Line 16, after the word "metrics" please insert an -- X --.

Column 22,
Line 12, please delete "S7" and insert -- t+1 --.
Line 13, please delete "the shortest path" and insert -- the path having the smallest metric --.

Signed and Sealed this

Thirtieth Day of December, 2003

JAMES E. ROGAN
*Director of the United States Patent and Trademark Office*